United States Patent
Dong

(10) Patent No.: US 9,411,734 B2
(45) Date of Patent: Aug. 9, 2016

(54) ELECTRONIC DEVICES HAVING SEMICONDUCTOR MEMORY UNITS AND METHOD OF FABRICATING THE SAME

(71) Applicant: SK hynix Inc., Icheon-Si (KR)

(72) Inventor: Cha-Deok Dong, Icheon-Si (KR)

(73) Assignee: SK hynix Inc., Icheon-Si (KR)

( * ) Notice: Subject to any disclaimer, the term of this patent is extended or adjusted under 35 U.S.C. 154(b) by 240 days.

(21) Appl. No.: 14/142,911

(22) Filed: Dec. 29, 2013

(65) Prior Publication Data

US 2015/0032960 A1     Jan. 29, 2015

(30) Foreign Application Priority Data

Jul. 25, 2013   (KR) .................. 10-2013-0088097

(51) Int. Cl.
| | |
|---|---|
| *H01L 43/02* | (2006.01) |
| *H01L 27/22* | (2006.01) |
| *G06F 12/08* | (2016.01) |
| *H01L 43/08* | (2006.01) |

(52) U.S. Cl.
CPC ........ *G06F 12/0842* (2013.01); *G06F 12/0897* (2013.01); *H01L 27/222* (2013.01); *H01L 43/08* (2013.01)

(58) Field of Classification Search
CPC .................. H01L 43/08; H01L 27/222; G11C 11/14–11/16; G11C 11/161
See application file for complete search history.

(56) References Cited

U.S. PATENT DOCUMENTS

| | | | | |
|---|---|---|---|---|
| 8,959,250 | B2 * | 2/2015 | Lee ......................... | H01L 43/08 710/11 |
| 8,994,131 | B2 * | 3/2015 | Shimomura ......... | G11C 11/161 257/421 |
| 9,042,166 | B2 * | 5/2015 | Toko ....................... | H01L 43/08 365/158 |
| 2013/0037862 | A1 * | 2/2013 | Kitagawa ................ | H04L 43/08 257/252 |
| 2014/0250244 | A1 * | 9/2014 | Song ..................... | G06F 3/0673 710/5 |
| 2015/0008548 | A1 * | 1/2015 | Noma .................... | H01L 43/02 257/421 |
| 2015/0052302 | A1 * | 2/2015 | Dong .................... | H01L 27/222 711/118 |
| 2015/0092481 | A1 * | 4/2015 | Lee ......................... | H01L 43/08 365/158 |
| 2015/0249206 | A1 * | 9/2015 | Kim ....................... | H01L 43/08 257/421 |

FOREIGN PATENT DOCUMENTS

KR           100271141      8/2000

\* cited by examiner

*Primary Examiner* — Allison P Bernstein
(74) *Attorney, Agent, or Firm* — Perkins Coie LLP

(57) ABSTRACT

Electronic devices have a semiconductor memory unit including a magnetization compensation layer in a contact plug. One implementation of the semiconductor memory unit includes a variable resistance element having a stacked structure of a first magnetic layer, a tunnel barrier layer, and a second magnetic layer, and a contact plug arranged in at least one side of the variable resistance element and comprising a magnetization compensation layer. Another implementation includes a variable resistance element having a stacked structure of a first magnetic layer having a variable magnetization, a tunnel barrier layer, and a second magnetic layer having a pinned magnetization; and a contact plug arranged at one side of and separated from the variable resistance element to include a magnetization compensation layer that produces a magnetic field to reduce an influence of a magnetic field of the second magnetic layer on the first magnetic layer.

28 Claims, 27 Drawing Sheets

ELECTRONIC DEVICES HAVING SEMICONDUCTOR MEMORY UNITS AND METHOD OF FABRICATING THE SAME

CROSS-REFERENCE TO RELATED APPLICATIONS

The present application claims priority of Korean Patent Application No. 10-2013-0088097, entitled "ELECTRONIC DEVICE AND METHOD FOR FABRICATING THE SAME" and filed on Jul. 25, 2013, which is incorporated herein by reference in its entirety.

TECHNICAL FIELD

This patent document relates to memory circuits or devices and their applications in electronic devices or systems.

BACKGROUND

Recently, as electronic devices or appliances trend toward miniaturization, low power consumption, high performance, multi-functionality, and so on, there is a demand for semiconductor devices capable of storing information in various electronic devices or appliances such as a computer, a portable communication device, and so on, and research has and development for such semiconductor devices have been conducted for the semiconductor devices. Examples of such semiconductor devices include semiconductor devices which can store data using a characteristic switched between different resistance states according to an applied voltage or current, and can be implemented in various configurations, for example, resistive random access memory (RRAM), phase-change random access memory (PRAM), ferroelectric random access memory (FRAM), magnetic random access memory (MRAM), an E-fuse, etc.

SUMMARY

The disclosed technology in this patent document includes memory circuits or devices and their applications in electronic devices or systems and various implementations of an electronic device in which a semiconductor memory unit is provided to include a variable resistance element having magnetic layers and a contact plug having a magnetization compensation layer. In some implementations of the variable resistance element and the contact plug with a magnetic compensation layer, an etch margin may be secured and the difficulty level of the process for fabricating the variable resistance element may be reduced/minimized.

In one aspect, an electronic device is provided to include a semiconductor memory unit that includes a variable resistance element having a stacked structure of a first magnetic layer, a tunnel barrier layer, and a second magnetic layer, and a contact plug arranged in at least one side of the variable resistance element and comprising a magnetization compensation layer.

Implementations of the above electronic device may include one or more the following.

The magnetization compensation layer may have a thickness larger than a critical dimension (CD) thereof. The magnetization compensation layer may comprise a conductive material having a horizontal magnetic property. The magnetization compensation layer may comprise one or more of Co, Fe, Ni, Nd, and a mixture thereof. The semiconductor memory may comprise a plurality of variable resistance elements, and the contact plug may be formed between the plurality of variable resistance elements and arranged at a predetermined interval from the plurality of variable resistance elements. The plurality of variable resistance elements may be arranged in a matrix shape. The magnetization compensation layer may have a thickness larger than the sum of thicknesses of the first and second magnetic layers. The first magnetic layer may comprise a pinned ferromagnetic layer and the second magnetic layer may comprise a free ferromagnetic layer, or the first magnetic layer may comprise a free ferromagnetic layer and the second magnetic layer may comprise a pinned ferromagnetic layer. The magnetization compensation layer may be formed have a top surface higher than or identical to that of the tunnel barrier layer of the adjacent variable resistance element, and may have sidewalls facing sidewalls of the tunnel barrier layer. The contact plug may comprise a metal layer, and may have a stacked structure of the metal layer and the magnetization compensation layer. The contact plug may comprise two metal layers, and the magnetization compensation layer may be formed between the two metal layers. The contact plug may comprise a metal layer, and the magnetization compensation layer may be formed in the metal layer.

The electronic device may further include a microprocessor which includes: a control unit configured to receive a signal including a command from an outside of the microprocessor, and performs extracting, decoding of the command, or controlling input or output of a signal of the microprocessor; an operation unit configured to perform an operation based on a result that the control unit decodes the command; and a memory unit configured to store data for performing the operation, data corresponding to a result of performing the operation, or an address of data for which the operation is performed, wherein the semiconductor memory unit that includes the variable resistance element is a part of the memory unit in the microprocessor.

The electronic device may further include a processor which includes: a core unit configured to perform, based on a command inputted from an outside of the processor, an operation corresponding to the command, by using data; a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the semiconductor memory unit that includes the variable resistance element is a part of the cache memory unit in the processor.

The electronic device may further include a processing system which includes: a processor configured to decode a command received by the processor and control an operation for information based on a result of decoding the command; an auxiliary memory device configured to store a program for decoding the command and the information; a main memory device configured to call and store the program and the information from the auxiliary memory device such that the processor may perform the operation using the program and the information when executing the program; and an interface device configured to perform communication between at least one of the processor, the auxiliary memory device and the main memory device and the outside, wherein the semiconductor memory unit that includes the variable resistance element is a part of the auxiliary memory device or the main memory device in the processing system.

The electronic device may further include a data storage system which includes: a storage device configured to store data and conserve stored data regardless of power supply; a controller configured to control input and output of data to and from the storage device according to a command inputted form an outside; a temporary storage device configured to temporarily store data exchanged between the storage device and the outside; and an interface configured to perform communication between at least one of the storage device, the controller and the temporary storage device and the outside, wherein the semiconductor memory unit that includes the variable resistance element is a part of the storage device or the temporary storage device in the data storage system.

The electronic device may further include a memory system which includes: a memory configured to store data and conserve stored data regardless of power supply; a memory controller configured to control input and output of data to and from the memory according to a command inputted form an outside; a buffer memory configured to buffer data exchanged between the memory and the outside; and an interface configured to perform communication between at least one of the memory, the memory controller and the buffer memory and the outside, wherein the semiconductor memory unit that includes the variable resistance element is a part of the memory or the buffer memory in the memory system.

In another aspect, an electronic device is provided to include a semiconductor memory unit that includes: a variable resistance element having a stacked structure of a first magnetic layer having a variable magnetization, a tunnel barrier layer, and a second magnetic layer having a pinned magnetization, and a contact plug arranged at one side of the variable resistance element and separated from the variable resistance element, the contact plug comprising a magnetization compensation layer that produces a magnetic field at the variable resistance element to reduce an influence of a magnetic field of the second magnetic layer on the first magnetic layer.

Implementations of the above electronic device may include one or more the following.

The magnetization compensation layer may have a thickness greater than a critical dimension (CD) thereof. The magnetization compensation layer may comprise a conductive material having a horizontal magnetic property in that a magnetization of the magnetization compensation layer is in a plane of the magnetization compensation layer. The magnetization compensation layer may comprise one of Co, Fe, Ni or Nd, or a mixture of two or more of Co, Fe, Ni or Nd. The semiconductor memory may comprise a plurality of variable resistance elements, the contact plug may be provided between adjacent variable resistance elements to be arranged at a predetermined interval from each of the adjacent variable resistance elements so that the magnetization compensation layer in the contact plug produces an equal magnetic field at the adjacent variable resistance elements. The plurality of variable resistance elements may be arranged in a matrix shape. The magnetization compensation layer may have a thickness greater than the sum of thicknesses of the first and second magnetic layers. The first magnetic layer and the second magnetic layer may be ferromagnetic layers. The magnetization compensation layer may be formed to have a top surface higher than or identical to that of the tunnel barrier layer of the adjacent variable resistance element. The contact plug may comprise a metal layer, and may have a stacked structure of the metal layer and the magnetization compensation layer. The contact plug may comprise two metal layers, and the magnetization compensation layer may be formed between the two metal layers. The contact plug may comprise a metal layer, and the magnetization compensation layer may be formed in the metal layer.

The electronic device may further include a microprocessor which includes: a control unit configured to receive a signal including a command from an outside of the microprocessor, and performs extracting, decoding of the command, or controlling input or output of a signal of the microprocessor; an operation unit configured to perform an operation based on a result that the control unit decodes the command; and a memory unit configured to store data for performing the operation, data corresponding to a result of performing the operation, or an address of data for which the operation is performed, wherein the semiconductor memory unit that includes the variable resistance element is a part of the memory unit in the microprocessor.

The electronic device may further include a processor which includes: a core unit configured to perform, based on a command inputted from an outside of the processor, an operation corresponding to the command, by using data; a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the semiconductor memory unit that includes the variable resistance element is a part of the cache memory unit in the processor.

The electronic device may further include a processing system which includes: a processor configured to decode a command received by the processor and control an operation for information based on a result of decoding the command; an auxiliary memory device configured to store a program for decoding the command and the information; a main memory device configured to call and store the program and the information from the auxiliary memory device such that the processor may perform the operation using the program and the information when executing the program; and an interface device configured to perform communication between at least one of the processor, the auxiliary memory device and the main memory device and the outside, wherein the semiconductor memory unit that includes the variable resistance element is a part of the auxiliary memory device or the main memory device in the processing system.

The electronic device may further include a data storage system which includes: a storage device configured to store data and conserve stored data regardless of power supply; a controller configured to control input and output of data to and from the storage device according to a command inputted form an outside; a temporary storage device configured to temporarily store data exchanged between the storage device and the outside; and an interface configured to perform communication between at least one of the storage device, the controller and the temporary storage device and the outside, wherein the semiconductor memory unit that includes the variable resistance element is a part of the storage device or the temporary storage device in the data storage system.

The electronic device may further include a memory system which includes: a memory configured to store data and conserve stored data regardless of power supply; a memory controller configured to control input and output of data to and from the memory according to a command inputted form an outside; a buffer memory configured to buffer data exchanged between the memory and the outside; and an interface configured to perform communication between at least one of the memory, the memory controller and the buffer memory and the outside, wherein the semiconductor memory unit that includes the variable resistance element is a part of the memory or the buffer memory in the memory system.

In another aspect, an electronic device is provided to include a semiconductor memory unit that includes: a variable resistance element having a stacked structure of a first magnetic layer, a tunnel barrier layer, and a second magnetic layer, and a contact plug arranged at one side of the variable resistance element and comprising a ring-type magnetization compensation layer that produces a magnetic field at the variable resistance element to offset another magnetic field at the variable resistance element.

Implementations of the above electronic device may include one or more the following.

The magnetization compensation layer may be formed to have a top surface higher than or identical to that of the tunnel barrier layer of the adjacent variable resistance element, and may have sidewalls facing sidewalls of the tunnel barrier layer. The contact plug may comprise a metal layer, and the magnetization compensation layer may be formed over the metal layer so as to surround a part of the metal layer. The contact plug may comprise a metal layer, and the metal layer may be formed in the magnetization compensation layer.

In another aspect, an electronic device is provided to include a semiconductor memory unit that includes: a variable resistance element having a stacked structure of a first magnetic layer, a tunnel barrier layer, and a second magnetic layer, and a contact plug arranged at one side of the variable resistance element and comprising a cylinder-type magnetization compensation layer that produces a magnetic field at the variable resistance element to offset another magnetic field at the variable resistance element.

Implementations of the above electronic device may include one or more of the following.

The magnetization compensation layer may be formed to have a top surface higher than or identical to that of the tunnel barrier layer of the adjacent variable resistance element, and may have sidewalls facing sidewalls of the tunnel barrier layer. The contact plug may comprise first and second metal layers, and the magnetization compensation layer having the second metal layer may be positioned over the first metal layer. The contact plug may comprise a metal layer, and the metal layer may be formed in the magnetization compensation layer.

In another aspect, an electronic device is provided to include a semiconductor memory unit that includes at least two variable resistance elements, each variable resistance element having a stacked structure of a free magnetic layer, a tunnel barrier layer, and a pinned magnetic layer; and a contact plug arranged between a pair of the variable resistance elements to be apart from each of the two variable resistance elements and including a magnetization compensation layer having an opposite magnetization direction to an magnetization direction of the pinned magnetic layer.

In yet another aspect, a method is provided for fabricating an electronic device having a semiconductor memory unit. This method includes: forming variable resistance elements over a substrate, each variable resistance element having a stacked structure of a first magnetic layer, a tunnel barrier layer, and a second magnetic layer; and forming contact plugs arranged between the variable resistance elements and each contact plug including a magnetization compensation layer and be spaced from adjacent variable resistance elements at equal distances.

Implementations of the above method may include one or more of the following.

The forming of the variable resistance element may comprise: forming the first magnetic layer over the substrate; forming the tunnel barrier layer over the first magnetic layer; forming the second magnetic layer over the tunnel barrier layer; and forming a variable resistance element by patterning the second magnetic layer, the tunnel barrier layer, and the first magnetic layer. The magnetization compensation layer has a thickness greater than a CD thereof. The magnetization compensation layer may comprise a conductive material having a horizontal magnetic property, i.e., a magnetization in the plane of the magnetization compensation layer. The magnetization compensation layer may be formed using any one process including sputtering, PECVD (Plasma Enhanced Chemical Vapor Deposition), LPCVD (Low Pressure Chemical Vapor Deposition), and ALD (Atomic Layer Deposition). The magnetization compensation layer may be patterned in each contact plug to have a pillar shape, a cylinder shape, or a ring shape.

These and other aspects, implementations and associated advantages are described in greater detail in the drawings, the description and the claims.

DETAILED DESCRIPTION

Figure 1:
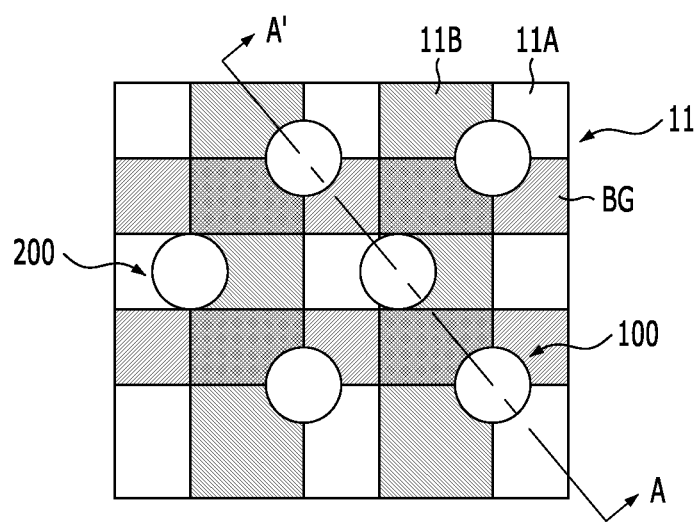
FIG. 1 is a plan view of an electronic device.

Various examples and implementations of the disclosed technology are described below in detail with reference to the accompanying drawings.

The drawings may not be necessarily to scale and in some instances, proportions of at least some of structures in the drawings may have been exaggerated in order to clearly illustrate certain features of the described examples or implementations. In presenting a specific example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer structure may not reflect all layers present in that particular multilayer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

The technology disclosed in this patent document can be implemented to provide an electronic device including a semiconductor memory unit that includes a variable resistance element capable of reducing the total thickness of a stack to lower an etch burden during a patterning process and a method for fabricating the same. In various variable resistance element designs based on switching of magnetization of a free layer, a vertical variable resistance element includes a magnetization compensation layer formed over a first magnetic layer having a pinned magnetization perpendicular to the layer (i.e., in the vertical direction), to prevent a magnetization of a second magnetic layer having a free magnetization layer that can change its magnetization direction in the vertical direction from being shifted by a stray field of the pinned layer. Due to the thickness of the magnetization compensation layer commonly used in such elements, the magnetic properties of sidewalls may deteriorate by etch damage during a patterning process. Further, it may be difficult in such devices to achieve higher degree of integration due to re-deposition of etch by-products. Furthermore, a process margin may be reduced due to an increase of time for etching. Implementations of the technology disclosed in this patent document can be used to provide an electronic device including a semiconductor memory unit that includes a variable resistance element capable of reducing the total thickness of the device to effectively form a magnetization compensation layer, and a method for fabricating the same.

FIG. 1 is a plan view of an electronic device in accordance with an implementation of this patent document.

Referring to FIG. 1, an isolation layer 11A and a line-type active region 11B may be formed in a semiconductor substrate 11. Furthermore, a switching element (BG, buried gate) may be formed in a direction crossing the active region 11B. FIG. 1 illustrates the line-type active region 11B and the switching element BG. The above structure is one of various implementations. For example, the active region 11B may include an island-type active region. The switching element BG may include gates in other applicable gate configurations such as a recess-type gate, a flat gate, and/or a vertical gate.

Variable resistance elements 100, source line contacts (SLC) 200 and the like may be formed over the active region 11B. The variable resistance elements 100 may be arranged in a matrix shape. Furthermore, the variable resistance elements 100 and the source lines contacts 200 may be arranged so as not to overlap with each other, and each of the source line contacts 200 may be arranged between a pair of switching elements BG. Furthermore, each of the source line contacts 200 may be arranged at a predetermined interval apart from adjacent variable resistance elements 100.

Figure 2:
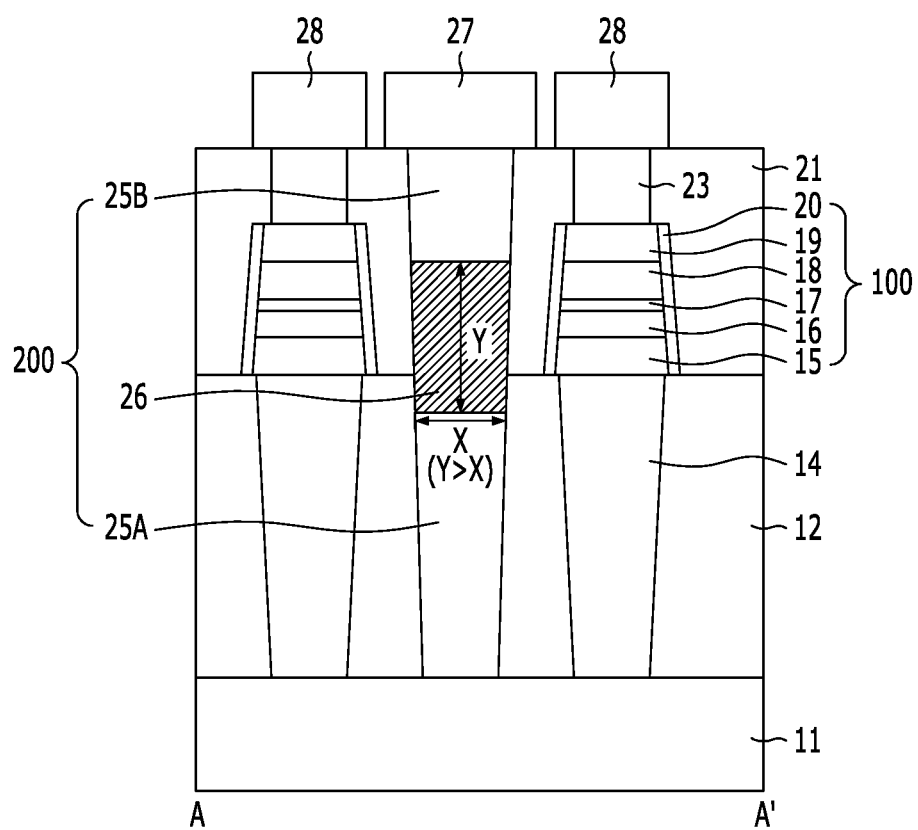
FIG. 2 is a cross-sectional view of the electronic device taken along line A-A' of FIG. 1.

FIG. 2 is a cross-sectional view of the electronic device in accordance with the implementation of this patent document, which includes parts taken along line A-A' of FIG. 1.

Referring to FIG. 2, the electronic device in accordance with the implementation of this patent document includes a substrate 11 having a predetermined structure, for example, a switching element (not shown) formed therein, a first interlayer dielectric layer 12 formed over the substrate 11, and a first contact plug 14 electrically connecting one end of the switching element to the variable resistance element 100 by penetrating the first interlayer dielectric layer 12. The variable resistance element 100 is formed over the first interlayer dielectric layer 12. The electronic device further includes a second interlayer dielectric layer 21 buried between the variable resistance elements 100, and first and second conductive lines 27 and 28 formed over the second interlayer dielectric layer 21. The electronic device further includes a second contact plug 23 which electrically connects the variable resistance element 100 and the second conductive line 28 by penetrating the second interlayer dielectric layer 21 over the variable resistance element 100. Furthermore, the electronic device includes the source line contact 200 as a contact plug, connecting the first conductive line 27 and the substrate 11 through the first and second interlayer dielectric layers 12 and 21 between the variable resistance elements 100. In particular, the source line contact 200 includes a magnetization compensation layer 26 for preventing a magnetic field shift of the adjacent variable resistance elements 100.

The variable resistance element 100 may have a stacked structure of a first electrode 15, a first magnetic layer 16, a tunnel barrier layer 17, a second magnetic layer 18, and a second electrode 19. Furthermore, the variable resistance element 100 may include a spacer 20 on sidewalls thereof. Notably, the stacked structure of the variable resistance element 100 does not include a magnetization compensation layer and the desired magnetization compensation is effectuated by a magnetization compensation layer external to the stack structure of the variable resistance element 100 from an adjacent structure as described below.

The variable resistance element 100 may have a characteristic of switching between different resistance states depending on the magnetization directions of the two magnetic layers 16 and 18. For example, when the magnetization directions of the two magnetic layers 16 and 18 are equal to each other (or parallel to each other), the variable resistance element 100 may have a low-resistance state, and when the magnetization directions of the two magnetic layers 16 and 18 are different from each other (or anti-parallel to each other), the variable resistance element 100 may have a high-resistance state.

Any one of the first and second magnetic layers 16 and 18 may function as a pinned ferromagnetic layer of which the magnetization direction is pinned, and the other one may function a free ferromagnetic layer of which the magnetization direction is varied according to the direction of a current applied to the variable resistance element 100. The first and second magnetic layers 16 and 18 may include a single layer or multilayer containing a ferromagnetic material, for example, Fe—Pt alloy, Fe—Pd alloy, Co—Pd alloy, Co—Pt alloy, Co—Fe alloy, Fe—Ni—Pt alloy, Co—Fe—Pt alloy, or Co—Ni—Pt alloy. The first and second magnetic layers 16 and 18 may further include impurities such as boron (B). Other implementations are possible.

The tunnel barrier layer 17 may change the magnetization direction of the free ferromagnetic layer through electron tunneling. The tunnel barrier layer 17 may include a single layer or multilayer containing a dielectric material, for example, oxide such as $Al_2O_3$, MgO, CaO, SrO, TiO, VO, or NbO. Other implementations are possible.

The first electrode 15, the second electrode 19, and the conductive lines 27 and 28 may include a metallic layer. The metallic layer may include a conductive layer containing a metal element, and may include metal, metal oxide, metal nitride, metal oxynitride, metal silicide and the like. Furthermore, the conductive lines 27 and 28 may be simultaneously formed using the same mask. Depending on parts connected thereto, the first conductive line 27 may serve as a source line, and the second conductive line 28 may serve as a bit line.

The first electrode 15 may serve as a bottom electrode of the variable resistance element 100, and the second electrode 19 may serve as a top electrode of the variable resistance element 100. The second electrode 19 may serve to protect lower layers of the variable resistance element 100 and serve as an etch barrier for patterning the lower layers during a process.

The switching element serves to select a specific unit cell in the electronic device including a plurality of unit cells. The switching element may be provided in each of the unit cells, and may include a transistor, a diode and the like. One end of the switching element may be electrically connected to the first contact plug 14, and the other end of the switching element may be electrically connected to a source line through the source line contact 200.

The first and second contact plugs 14 and 23 may include a semiconductor layer or metallic layer, and the variable resistance element 100 may have a critical dimension (CD) or area greater than the first and second contact plug 14 and 23.

The source line contact 200 may include a contact plug for electrically connecting the substrate 11 to the first conductive line 27. The source line contact 200 may be arranged so as not to be formed on the same line as the variable resistance elements 100. The source line contact 200 may be arranged to deviate from the variable resistance element 100. As illustrated in the example of FIG. 1, the source line contact 200 is formed not to overlap with the variable resistance elements 100. Further, if a plurality of variable resistance elements and a plurality of the source line contacts are formed, the above arrangement of the variable resistance element and the source line contact may be repeated. Furthermore, as illustrated in FIG. 1, one source line contact 200 may be disposed at a predetermined interval apart from four variable resistance elements 100. The above structure is one of various implementations. For example, one source line contact 200 may be disposed at a predetermined interval apart from adjacent variable resistance elements 100.

In the present implementation, the source line contact 200 may include metal layers 25A and 25B. The source line contact 200 may further include a magnetization compensation layer 26 for preventing a magnetic field shift of the variable resistance element 100.

The magnetization compensation layer 26 serves to prevent a magnetic field shift of the free ferromagnetic layer by offsetting the influence of a magnetic field on the free ferromagnetic layer, which is caused by the pinned ferromagnetic layer. The magnetization compensation layer 26 may have an opposite magnetization direction to the pinned ferromagnetic layer. The magnetization compensation layer may include a ferromagnetic material or anti-ferromagnetic material. For example, the magnetization compensation layer 26 may include a horizontal magnetic material, for example, a ferromagnetic substance such as Co, Fe, Ni, or Nb or a mixture thereof. In addition, the magnetization compensation layer 26 may include various magnetic materials which have a horizontal magnetic property and may be utilized as a part of wiring due to its conductivity.

The magnetization compensation layer 26 may be formed to have a top surface higher than or identical to that of the tunnel barrier layer 17 of the adjacent variable resistance element 100, and have sidewalls facing sidewalls of the tunnel barrier layer 17. The magnetization compensation layer 26 is formed to have a thickness greater than at least the total thickness of the first and second magnetic layers 16 and 18 such that magnetic fields introduced into the first and second magnetic layers 16 and 18 are maintained in a vertical direction. Furthermore, the magnetization compensation layer 26 may be formed to have a thickness (Y) greater than a critical dimension (CD) (X), i.e., Y>X, in order to induce a spin arrangement in a direction perpendicular to the layer (i.e., in the vertical direction).

The magnetization compensation layer 26 may be formed in a pillar type, ring type or cylinder type inside the source line contact 200. The magnetization compensation layer 26 may be formed to occupy whole or a part of the source line contact 200.

In the present implementation, the magnetization compensation layer 26 is not formed in the variable resistance element 100 but is formed outside the variable resistance element 100 and, specifically, is located in the source line contact 200 adjacent to the variable resistance element 100. Thus, the total thickness of the variable resistance element 100 is not affected by having the magnetization compensation layer 26 and, in comparison with other designs having the magnetization compensation layer in the magnetic element stack, the thickness of the variable resistance element stack can be reduced. As the magnetization compensation layer 26 is separately formed, the total thickness of the variable resistance element 100 can be reduced by the thickness of the magnetization compensation layer 26. Thus, it is possible to reduce an etch burden during a patterning process for forming the device. Further, sidewall damage during the patterning process and re-deposition of by-products may be reduced, and thus the magnetic property can be improved. Furthermore, as the magnetization compensation layer 26 is formed in the source line contact 200 and a horizontal magnetic material is used instead of a vertical magnetic material, it is possible to reduce the difficulty level of the process. The material composition, size and shape of the magnetization compensation layer may be suitably selected in various configurations. For example, a material composition may be selected for the magnetization compensation layer, which has a sufficient magnetic property allowing to control the shape and volume of the magnetization compensation layer 26.

Furthermore, since the source line contact 200 is positioned at a predetermined distance apart from adjacent variable resistance elements 100, a uniform magnetic field influence can be applied to the plurality of adjacent variable resistance elements 100 through one magnetization compensation layer 26. Furthermore, as the source line contact 200 is formed to have a thickness greater than that of the tunnel barrier layer 17 of the adjacent variable resistance element 100, uniform vertical magnetic fields can be introduced to the first and second magnetic layers 16 and 18.

FIGS. 3A to 3I are cross-sectional views for explaining a method for fabricating the electronic device in accordance with the implementation of this patent document. FIGS. 3A to 3I are cross-sectional views taken along line A-A' of FIG. 1.

Figure 3A:
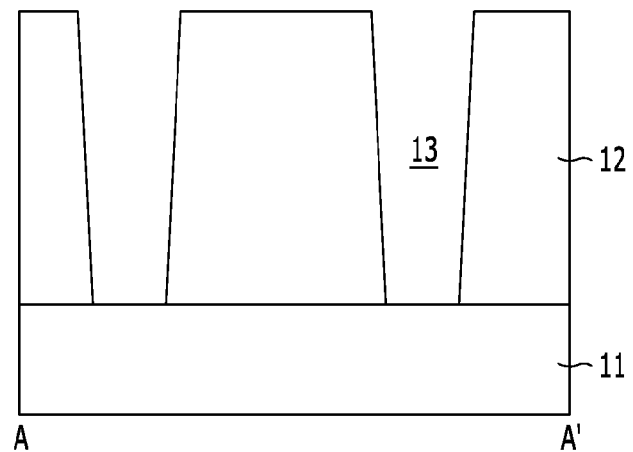
FIGS. 3A to 3I are cross-sectional views for explaining a method for fabricating the electronic device.

Referring to FIG. 3A, a substrate 11 having a predetermined structure including, for example, switching elements (not illustrated) and the like is prepared. The switching element may select a specific unit cell in the electronic device including a plurality of unit cells formed therein, and may include a transistor, a diode and the like. One end of the switching element may be electrically connected to a first contact plug to be described below, and the other end of the switching element may be electrically connected to a source line through a third contact plug to be described below.

A first interlayer dielectric layer 12 is formed over the substrate 11. The first interlayer dielectric layer 12 may include one single layer including oxide, nitride, and oxynitride or a stacked layer thereof.

A first contact hole 13 is formed to pass through the first interlayer dielectric layer 12 through which the substrate 11 is exposed.

Figure 3B:
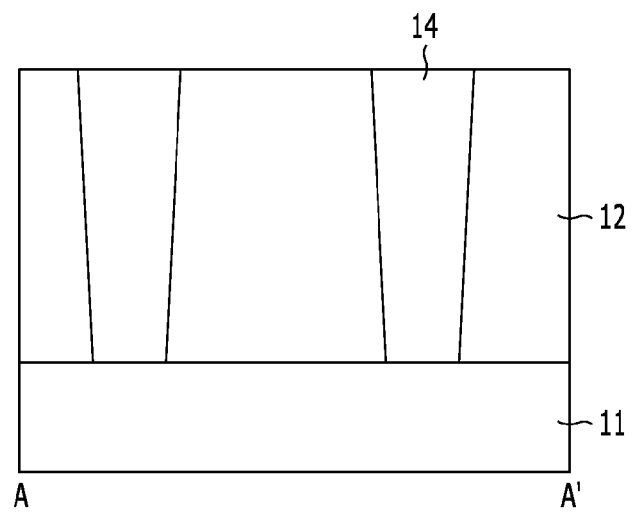

Referring to FIG. 3B, a conductive material (not shown) is formed to fill up or cover the first contact hole 13 to form a first contact plug 14. The first contact plug 14 may be formed by a series of processes of forming the conductive material on the entire surface of the resultant structure so as to gap-fill the first contact hole 13, and performing an isolation process to electrically isolate the first contact plugs 14. The isolation process may be performed by etching (or polishing) the conductive material formed on the entire surface through a blanket etch process (for example, an etch back process) or a chemical mechanical polishing process until the first interlayer dielectric layer 12 is exposed.

Figure 3C:
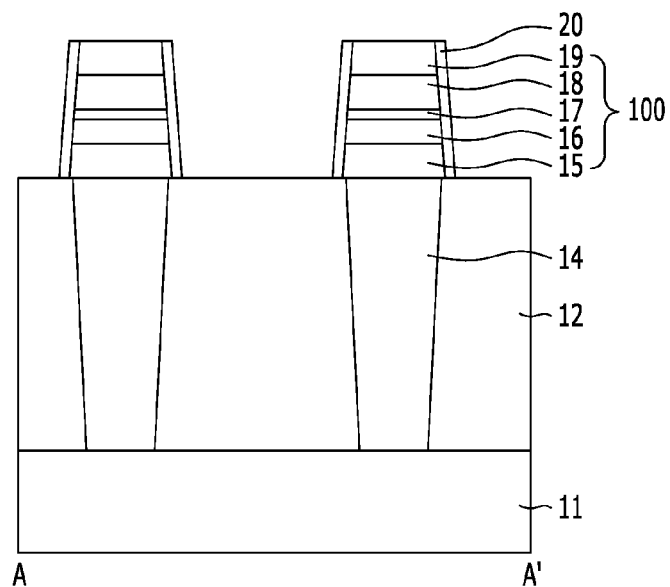

Referring to FIG. 3C, a variable resistance element 100 is formed over the first interlayer dielectric layer 12 including the first contact plug 14. The variable resistance element 100 may have a stacked structure of a first electrode 15, a first magnetic layer 16, a tunnel barrier layer 17, a second magnetic layer 18, and a second electrode 19, and may include a spacer 20 formed on sidewalls of the stacked structure. Although not illustrated, the variable resistance element 100 may further include a template layer, a coupling layer, and an interface layer for improving the characteristics of the respective magnetic layers.

In the present implementation, the variable resistance element 100 does not include a magnetization compensation layer in the stacked structure. Thus, since the total thickness of the stack can be reduced by the thickness of the magnetization compensation layer, it is possible to lower an etch burden during a patterning process for forming the device. Further, since sidewall damage during the patterning process and re-deposition of by-products can be reduced, it is possible to improve the magnetic property.

The variable resistance element 100 may have a characteristic of switching between different resistance states depending on the magnetization directions of the two magnetic layers 16 and 18. For example, when the magnetization directions of the two magnetic layers 16 and 18 are equal to each other (or parallel to each other), the variable resistance element 100 may have a low-resistance state, and when the magnetization directions of the two magnetic layers 16 and 18 are different from each other (or anti-parallel to each other), the variable resistance element 100 may have a high-resistance state.

Any one of the first and second magnetic layers 16 and 18 may function as a pinned ferromagnetic layer of which the magnetization direction is pinned, and the other may function as a free ferromagnetic layer of which the magnetization direction is varied according to the direction of a current applied to the variable resistance element 100. The first and second magnetic layers 16 and 18 may include a single layer or multilayer containing a ferromagnetic material, for example, Fe—Pt alloy, Fe—Pd alloy, Co—Pd alloy, Co—Pt alloy, Co—Fe alloy, Fe—Ni—Pt alloy, Co—Fe—Pt alloy, or Co—Ni—Pt alloy. The first and second magnetic layers 16 and 18 may further include impurities such as boron (B). Other implementations are possible.

The tunnel barrier layer 17 may change the magnetization direction of the free ferromagnetic layer through electron tunneling. The tunnel barrier layer 17 may include a single layer or multilayer containing a dielectric material, for example, oxide such as $Al_2O_3$, MgO, CaO, SrO, TiO, VO, or NbO. Other implementations are possible.

The first electrode 15 and the second electrode 19 may include a metallic layer. The metallic layer indicates a conductive layer containing a metal element, and may include a metal, metal oxide, metal nitride, metal oxynitride, metal silicide and the like.

The first electrode 15 may serve as a bottom electrode of the variable resistance element 100, and the second electrode 19 may serve as a top electrode of the variable resistance element 100. The second electrode 19 may protect lower layers of the variable resistance element 100 and serve as an etch barrier for patterning the lower layers during the process.

Figure 3D:
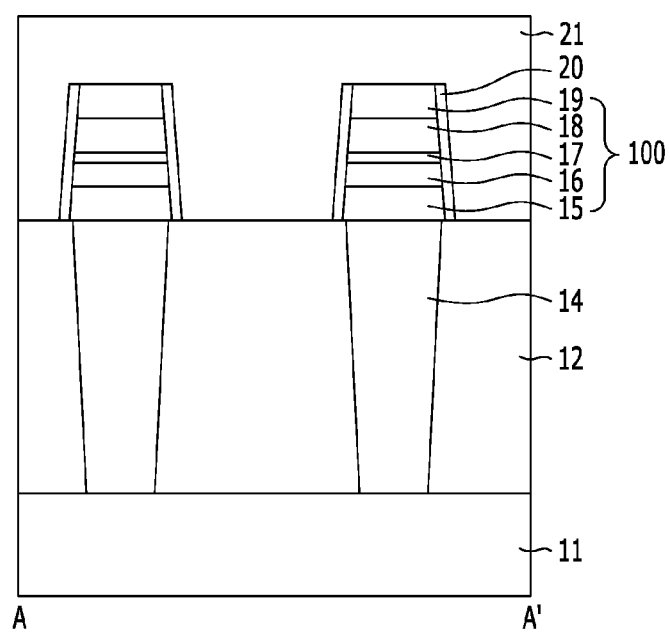

Referring to FIG. 3D, a second interlayer dielectric layer 21 is formed over the first interlayer dielectric layer 12. The second interlayer dielectric layer 21 may be formed to have a sufficient thickness to fill up or cover the space between the variable resistance elements 100. For example, the second interlayer dielectric layer 21 may be formed so that the top surface thereof is positioned at a higher level than the top surface of the variable resistance element 100. The second interlayer dielectric layer 21 may be formed of the same material as the first interlayer dielectric layer 12. The second interlayer dielectric layer 21 may include any single layer including oxide, nitride, and oxynitride or a stacked layer thereof.

Figure 3E:
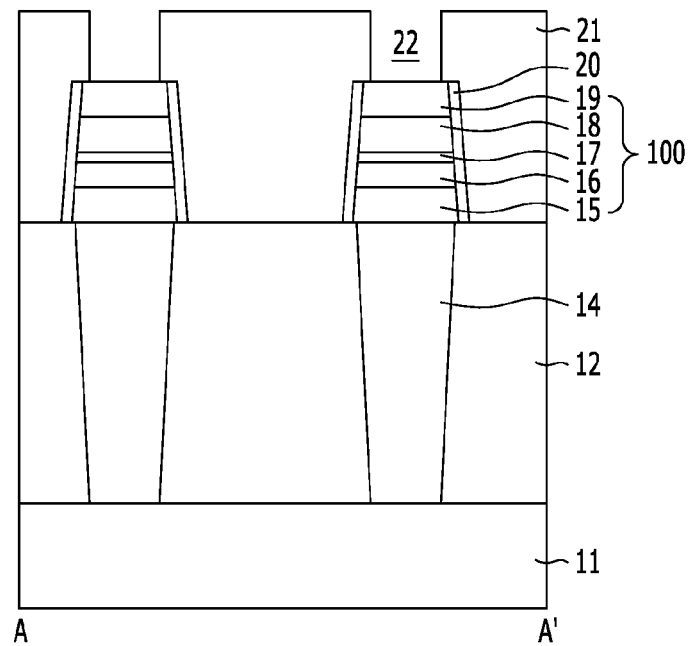

Referring to FIG. 3E, the second interlayer dielectric layer 21 is selectively etched to form a second contact hole 22 through which the top of the variable resistance element 100 is exposed.

Figure 3F:
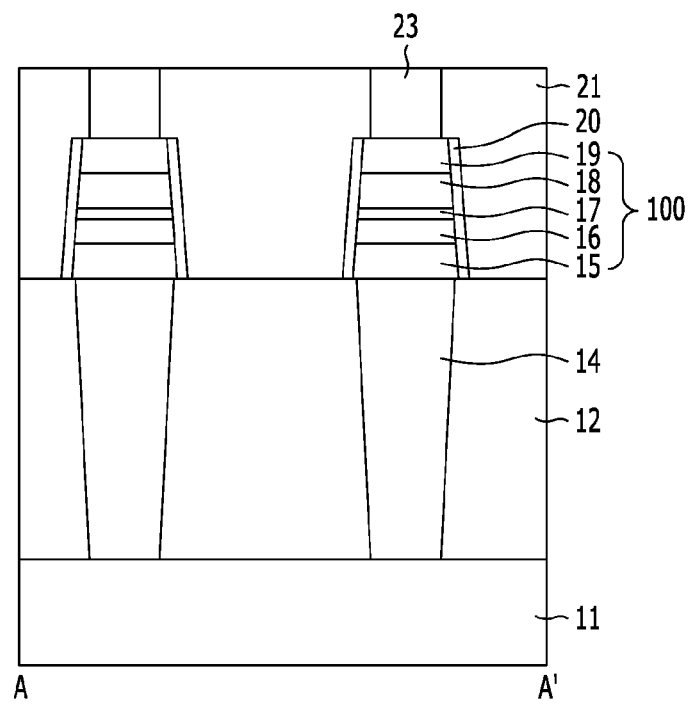

Referring to FIG. 3F, a second contact plug 23 is formed by burying a conductive material in the second contact hole 22. The second contact plug 23 may electrically connect the variable resistance element 100 to a conductive line which will be formed in a subsequent process, and may serve as an electrode, for example, a top electrode, for the variable resistance element 100. The second contact plug 23 may be formed of a semiconductor layer or metallic layer. The semiconductor layer may include silicon. The metallic layer is a material layer containing a metal, and may include a metal, metal oxide, metal nitride, metal oxynitride, metal silicide and the like.

The second contact plug 23 may be formed by a series of processes of forming a conductive material on the entire surface of the resultant structure to gap-fill the second contact hole 22 and performing an isolation process for electrically isolating the second contact plugs 23. The isolation process may be performed by etching (or polishing) the conductive material formed on the entire surface through a blanket etching process (for example, etch back process) or a chemical mechanical polishing process until the second interlayer dielectric layer 21 is exposed.

Figure 3G:
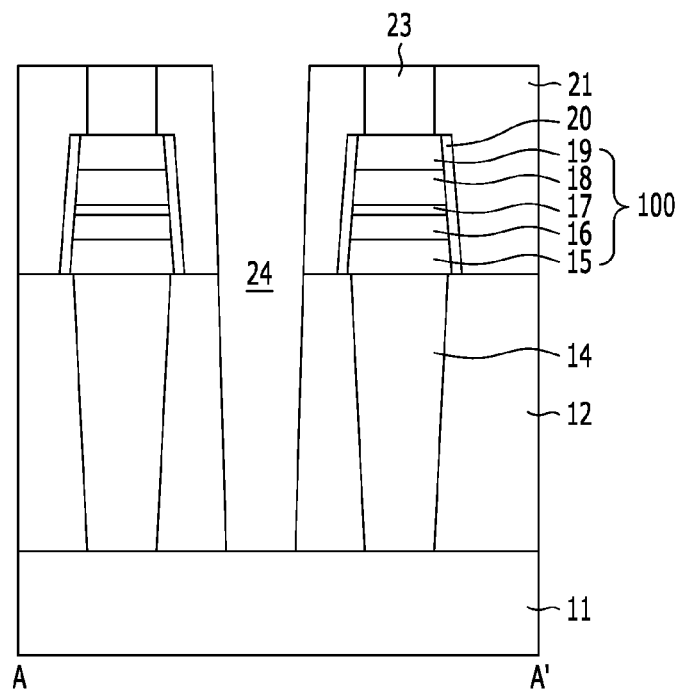

Referring to FIG. 3G, the first and second interlayer dielectric layers 12 and 21 between the variable resistance elements 100 are selectively etched to form a third contact hole 24 through which the substrate 11 is exposed.

The third contact hole 24 may be arranged so as not to be formed on the same line as the variable resistance elements 100. That is, the third contact hole 24 may be arranged to deviate from the variable resistance elements 100 as illustrated in FIG. 1. For example, the third contact hole 24 may be formed not to overlap with any variable resistance elements 100. Furthermore, the third contact hole 24 may be patterned in such a manner that each of third contact plugs, which will be formed in a subsequent process, is arranged at a predetermined distance from adjacent variable resistance elements 100 as illustrated in FIG. 1.

Figure 3H:
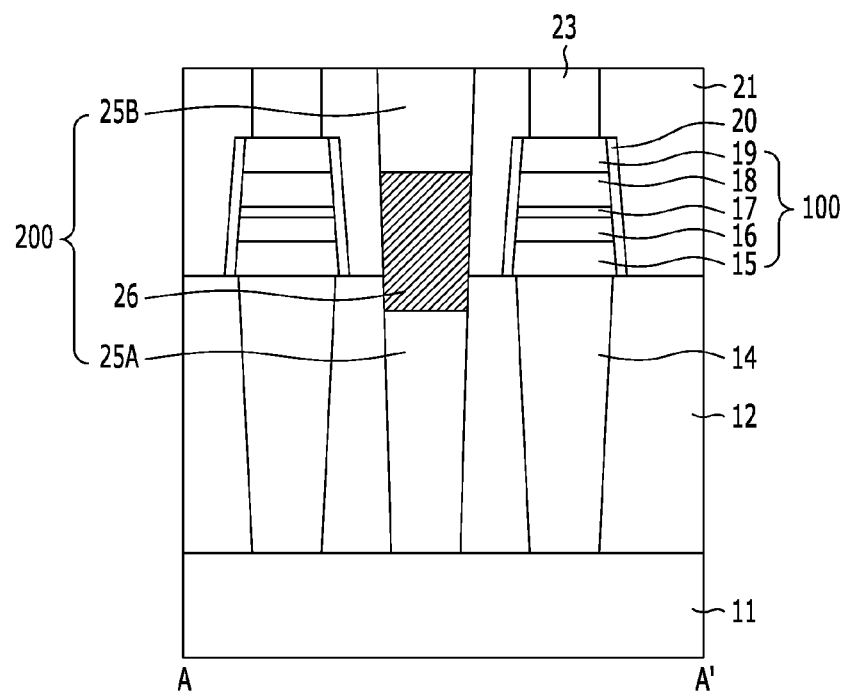

Referring to FIG. 3H, a source line contact 200 is formed by burying metal layers 25A and 25B and a magnetization compensation layer 26 in the third contact hole 24. The source line contact 200 may include a contact plug for electrically connecting the substrate 11 to a conductive line such as a source line, which will be formed in a subsequent process.

In the present implementation, the source line contact 200 may include the metal layers 25A and 25B for the electrical connection between the upper and lower layers. Further, the source line contact 200 may include a magnetization compensation layer 26 for preventing a magnetic field shift of the adjacent variable resistance elements 100.

The magnetization compensation layer 26 may offset the influence of magnetic fields on a free ferromagnetic layer, which is caused by a pinned ferromagnetic layer. Thus, a magnetic field shift of the free ferromagnetic layer can be prevented. The magnetization compensation layer 26 has an opposite magnetization direction to the magnetization direction of the pinned ferromagnetic layer, and may include a ferromagnetic material or anti-ferromagnetic material. For example, the magnetization compensation layer 26 may include a horizontal magnetic material, for example, a ferromagnetic substance such as Co, Fe, Ni, or Nb or a mixture thereof. In addition, the magnetization compensation layer 26 may include various magnetic materials which have a horizontal magnetic property and may be utilized as a part of wiring due to its conductivity.

The magnetization compensation layer 26 may be formed by sputtering, PECVD (Plasma Enhanced Chemical Vapor Deposition), LPCVD (Low Pressure Chemical Vapor Deposition), ALD (Atomic Layer Deposition) and the like.

The magnetization compensation layer 26 may be formed to have a top surface higher than or identical to that of the tunnel barrier layer 17 of the adjacent variable resistance element 100, and have sidewalls facing sidewalls of the tunnel barrier layer 17. The magnetization compensation layer 26 is formed to have a thickness greater than at least the total thickness of the first and second magnetic layers 16 and 18 such that magnetic fields introduced into the first and second magnetic layers 16 and 18 are maintained in a vertical direction. Furthermore, the magnetization compensation layer 26 may be formed to have a thickness (Y) greater than a CD (X), i.e., Y>X, in order to induce a spin arrangement in a vertical direction.

The magnetization compensation layer 26 may be formed in a pillar type, ring type or cylinder type inside the source line contact 200. The magnetization compensation layer 26 may be formed to occupy all or a part of the source line contact 200.

In the present implementation, as the magnetization compensation layer 26 is formed in the source line contact 200 and a horizontal magnetic material is used instead of a vertical magnetic material, the difficulty level of the process can be reduced. A material, size and shape of the magnetization compensation layer may be suitably selected in various configurations. For example, a material may be used for the magnetization compensation layer, which has a sufficient magnetic property allowing to control the shape and volume of the magnetization compensation layer 26.

Furthermore, since the source line contact 200 is positioned at a predetermined distance from adjacent variable resistance elements 100, the uniform influence of magnetic fields can be applied to the variable resistance elements 100 through one magnetization compensation layer 26. Furthermore, as the magnetization compensation layer 26 is formed to have a thickness greater than that of the tunnel barrier layer 17 of the adjacent variable resistance elements 100, uniform vertical magnetic fields can be introduced to the first and second magnetic layers 16 and 18.

Figure 3I:
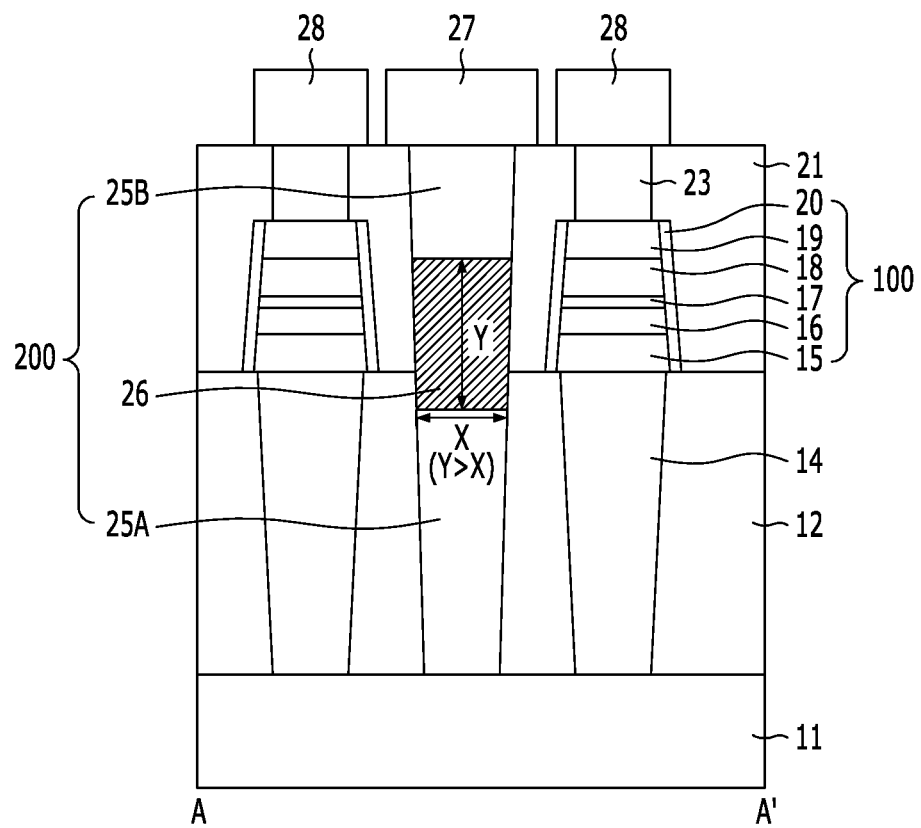

Referring to FIG. 3I, first and second conductive lines 27 and 28 are formed over the second interlayer dielectric layer 21 including the second contact plug 23 and the source line contact 200.

The first and second conductive lines 27 and 28 may include a metallic layer. The metallic layer may include a conductive layer containing a metal element, and may include a metal, metal oxide, metal nitride, metal oxynitride, metal silicide and the like. Furthermore, the conductive lines 27 and 28 may be simultaneously formed using the same mask. Depending on parts to be connected thereto, the first conductive line 27 may serve as a source line, and the second conductive line 28 may serve as a bit line.

FIGS. 4A to 4H and FIGS. 5A to 5H are cross-sectional views illustrating the structures of contact plugs including a magnetization compensation layer in accordance with the implementation of this patent document. The contact plugs illustrated in FIGS. 4 and 5 indicate the source line contact 200 of FIG. 2. FIGS. 4A to 4H illustrate a pillar-type magnetization compensation layer, FIGS. 5A to 5D illustrate a ring-type magnetization compensation layer, and FIGS. 5E to 5H illustrate a cylinder-type magnetization compensation layer.

As illustrated in FIGS. 4A to 4D, the magnetization compensation layer 26 may have a pillar-type structure to occupy a part or all of the source line contact 200. In particular, the magnetization compensation layer 26 may be formed to have a top surface higher than or identical to that of the tunnel barrier layer 17 of the adjacent variable resistance elements 100, and have sidewalls facing sidewalls of the tunnel barrier layer 17.

Figure 4A:
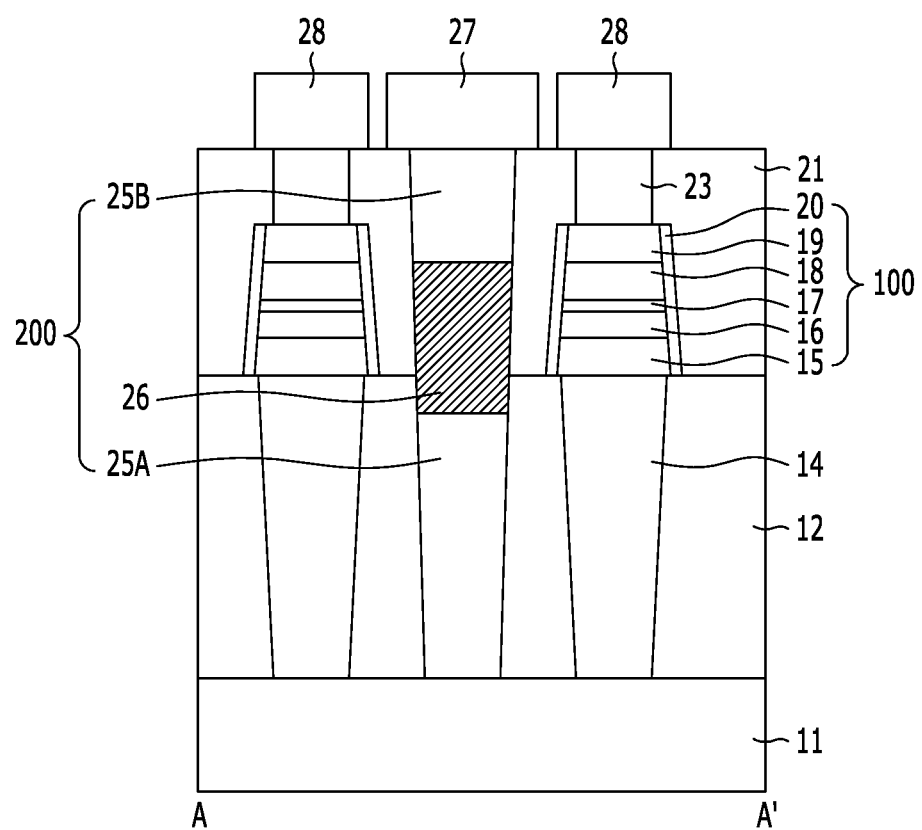
FIGS. 4A to 4H and FIGS. 5A to 5H are cross-sectional views illustrating the structures of contact plugs including a magnetization compensation layer.
Figure 4B:
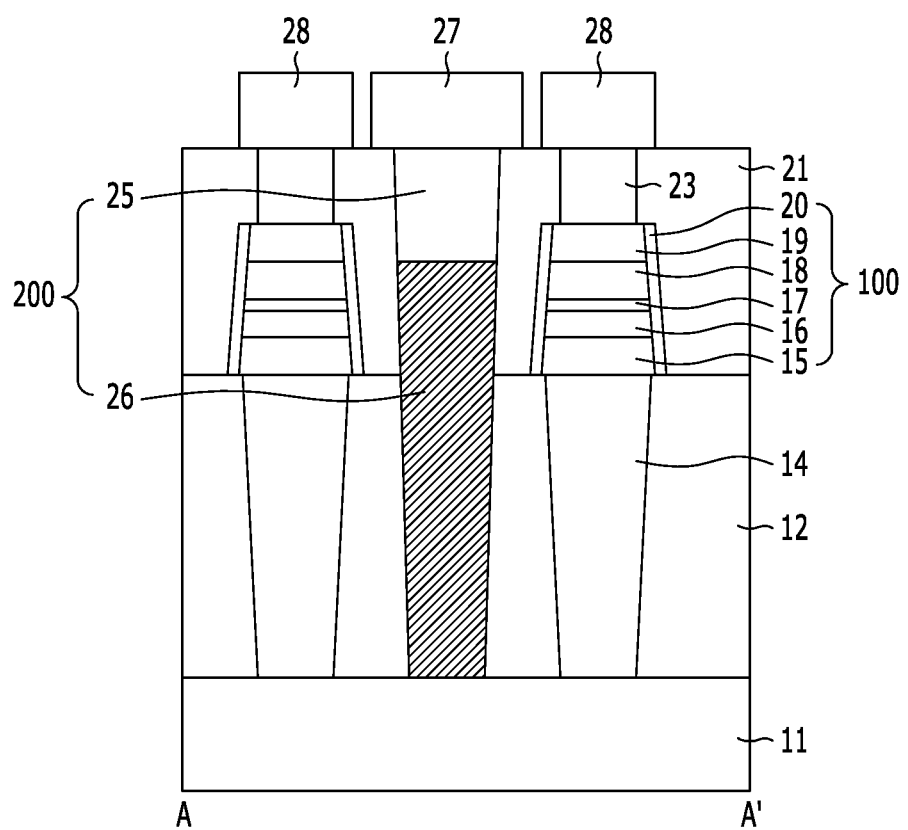
Figure 4C:
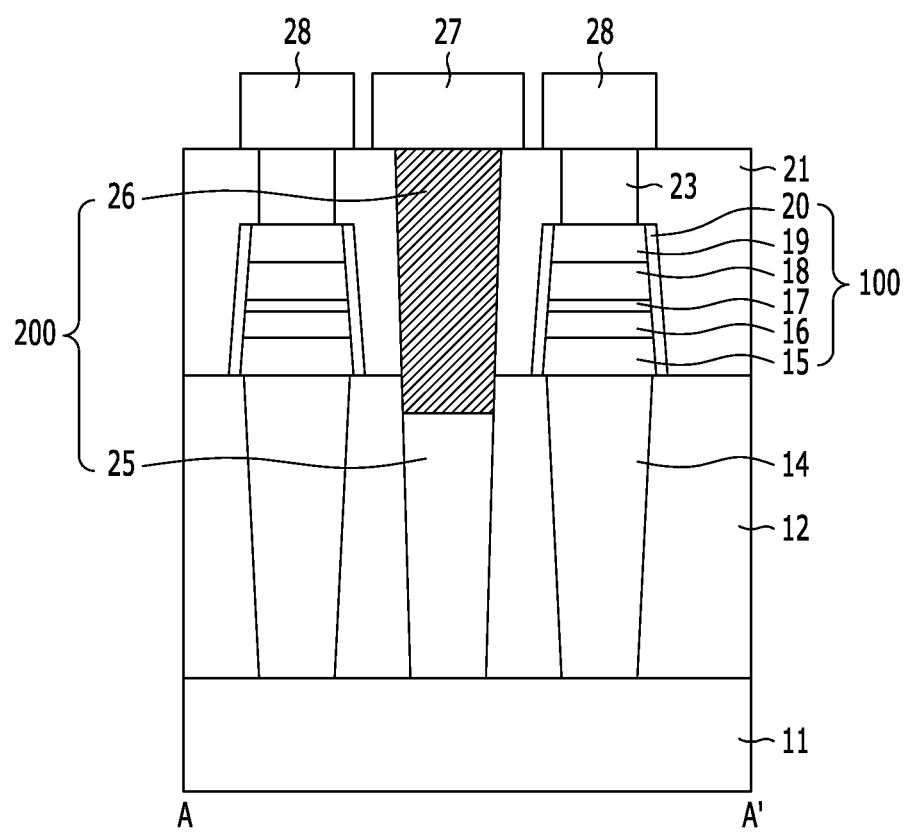
Figure 4D:
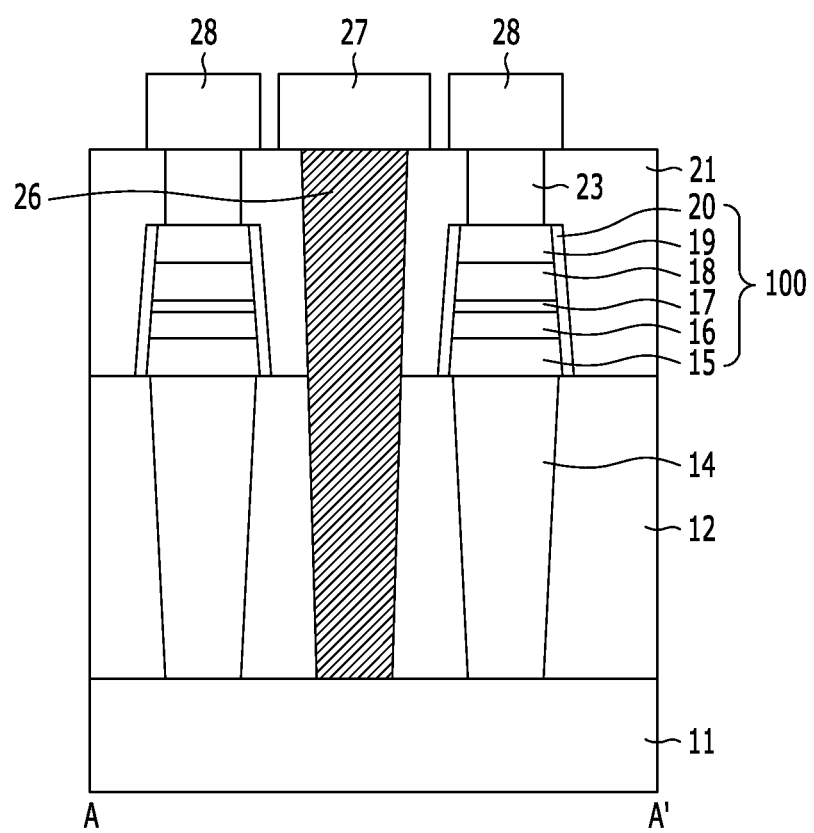

Various configurations can be provided for the position and size of the magnetization layer 26 inside the source line contact 200. For example, referring to FIG. 4A, the magnetization compensation layer 26 may be positioned in the middle of the source line contact 200 so as to be interposed between the metal layers 25A and 25B. Referring to FIG. 4B, the magnetization compensation layer 26 may be positioned in the lower part of the source line contact 200. Referring to FIG. 4C, the magnetization compensation layer 26 may be positioned in the upper part of the source line contact 200. Referring to FIG. 4D, the magnetization compensation layer 26 may occupy the entire source line contact 200.

When the magnetization compensation layer 26 is positioned in the middle, the upper part, or the lower part of the source line contact 200, the rest of the source line contact 200 excluding the magnetization compensation layer 26 may be formed of a metallic material.

Referring to FIGS. 4E to 4H, the magnetization compensation layer 26 may be surrounded by a metallic material. In particular, the magnetization compensation layer 26 may be formed to have a top surface higher than or identical to that of the tunnel barrier layer 17 of the adjacent variable resistance elements 100, and have sidewalls facing sidewalls of the tunnel barrier layer 17.

Figure 4E:
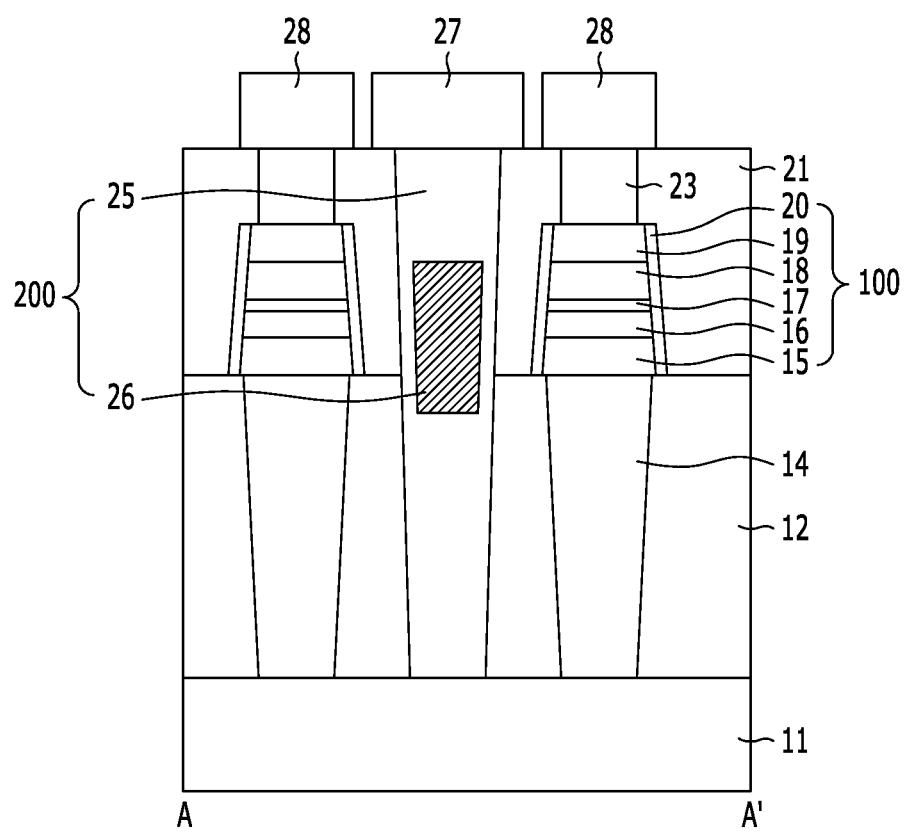
Figure 4F:
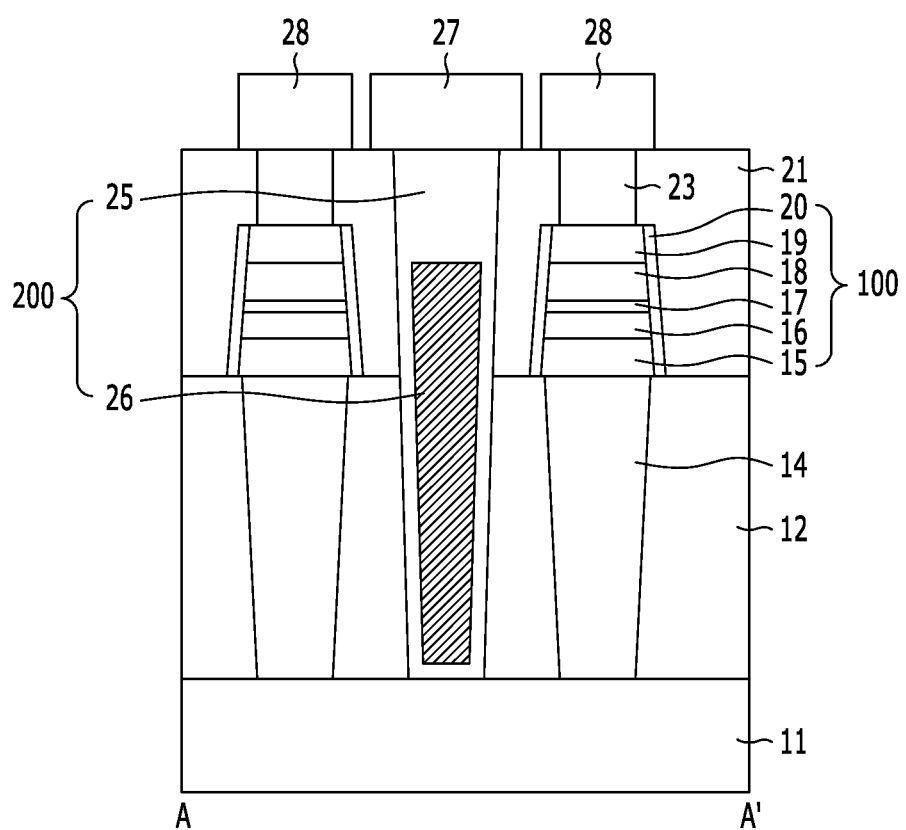
Figure 4G:
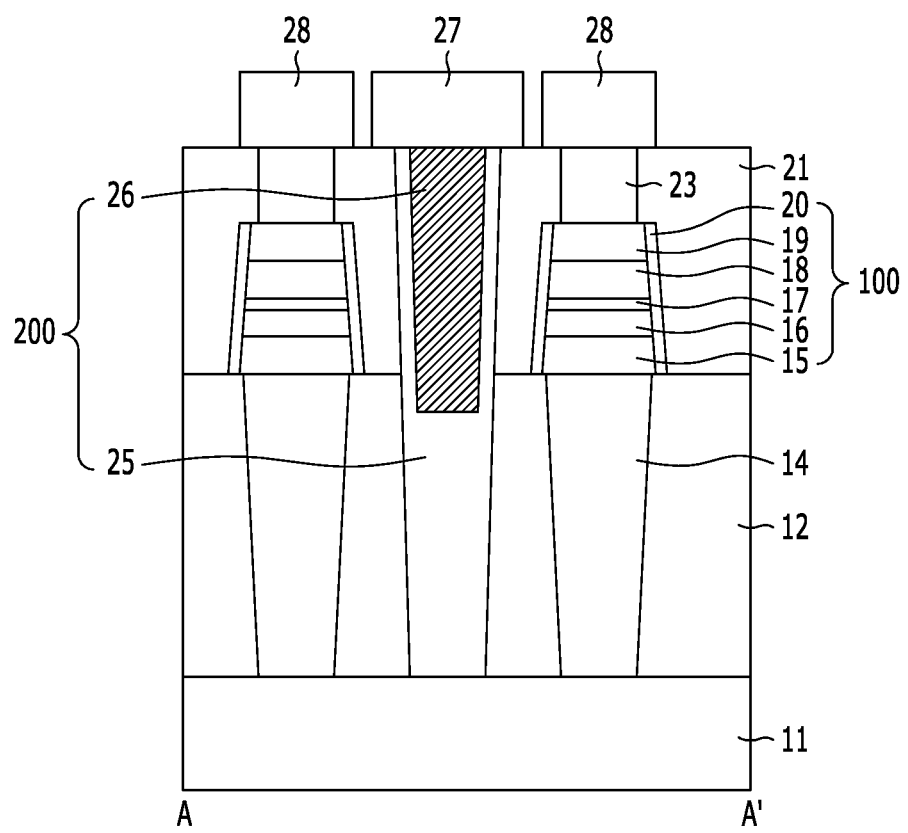
Figure 4H:
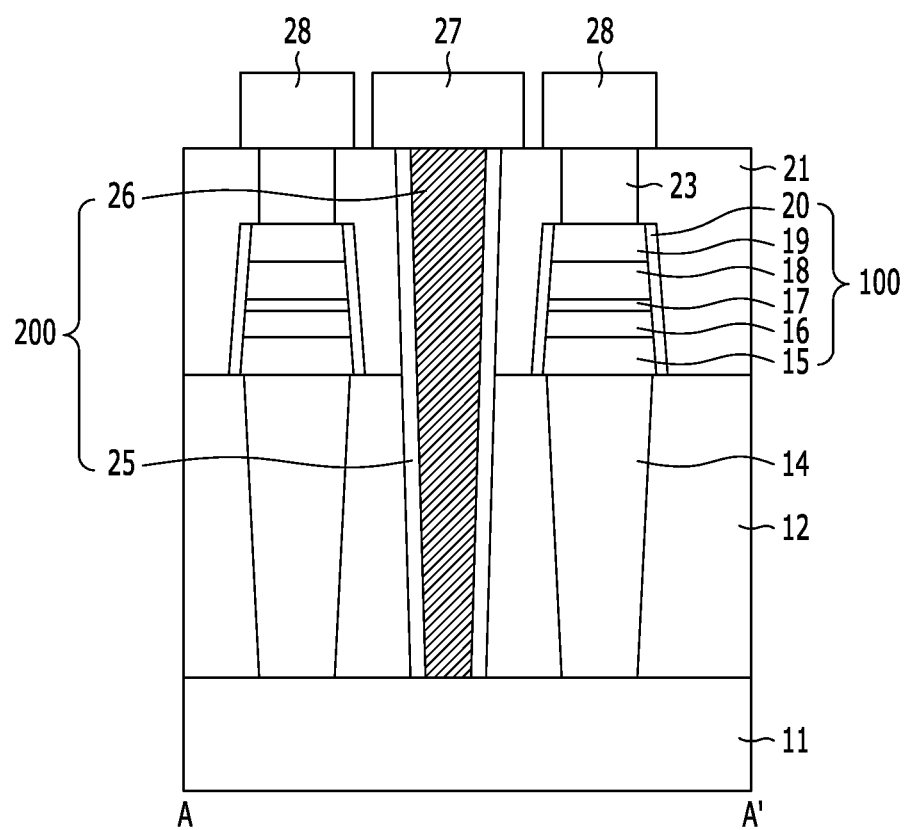

For example, referring to FIG. 4E, the magnetization compensation layer 26 may be positioned in the middle of the source line contact 200. Furthermore, referring to FIG. 4F, the magnetization compensation layer 26 may be positioned in the lower part of the source line contact 200. Furthermore, referring to FIG. 4G, the magnetization compensation layer 26 may be positioned in the upper part of the source line contact 200. Furthermore, referring to FIG. 4H, the magnetization compensation layer 26 may be formed to have the same height as the source line contact 200. At this time, the magnetization compensation layer 26 may be surrounded by a ring-shaped metal layer 26 having the same height.

Referring to FIGS. 5A to 5D, the magnetization compensation layer 26 may have a ring-type structure. For example, the magnetization compensation layer 26 may be formed to have a top surface higher than or identical to that of the tunnel barrier layer 17 of the adjacent variable resistance elements 100, and have sidewalls facing sidewalls of the tunnel barrier layer 17.

Figure 5A:
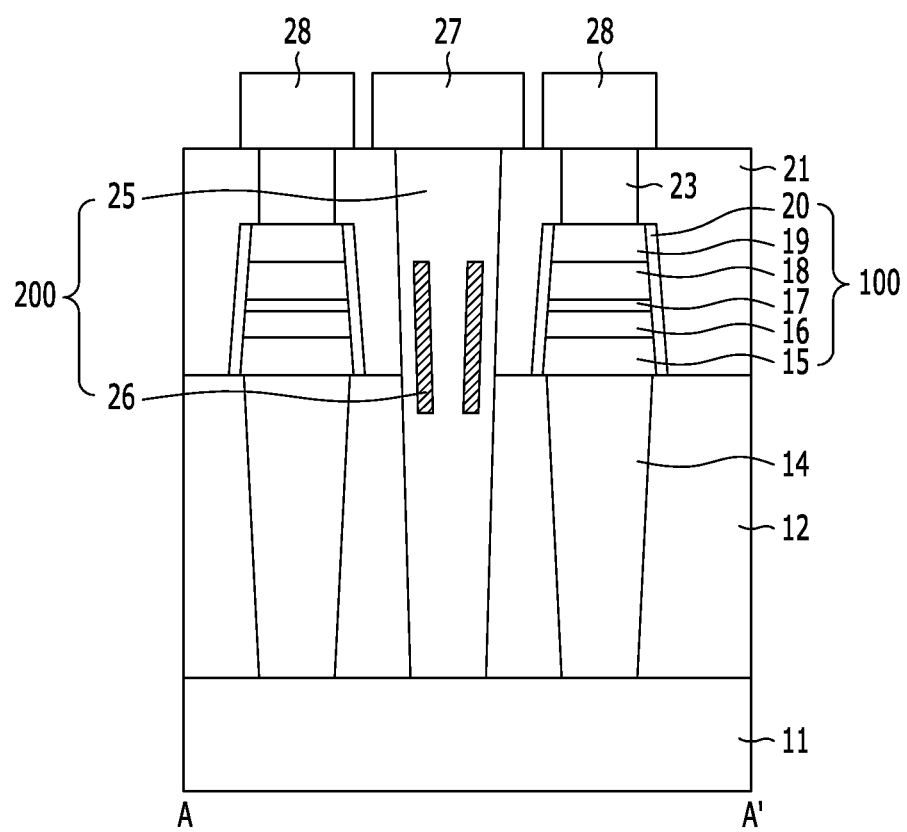
Figure 5B:
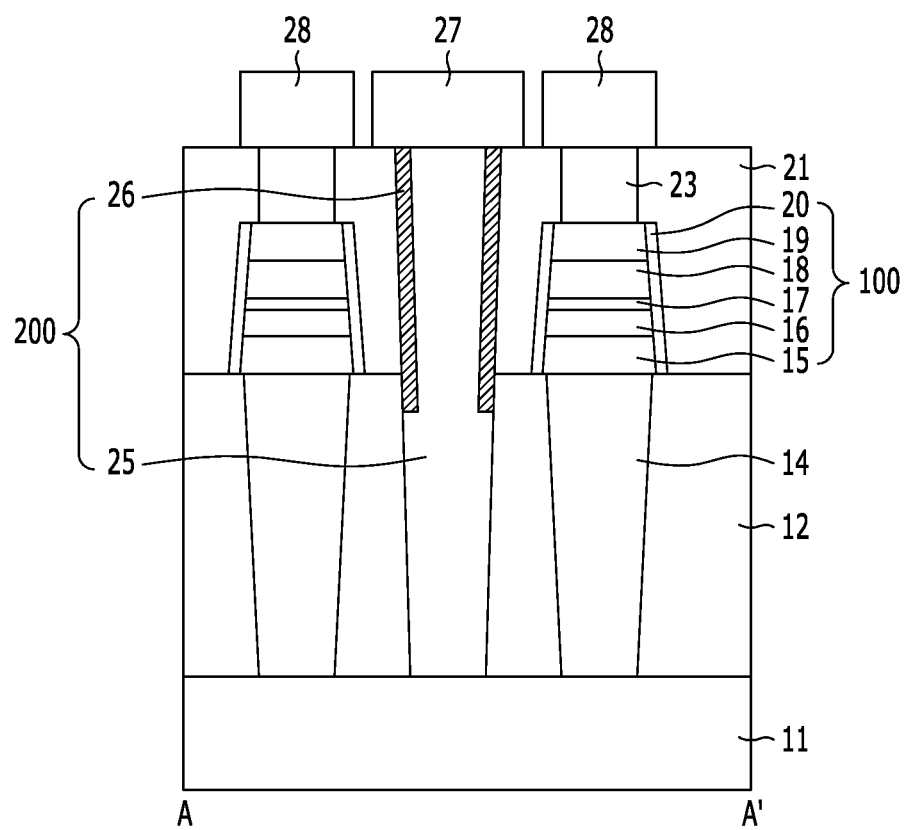
Figure 5C:
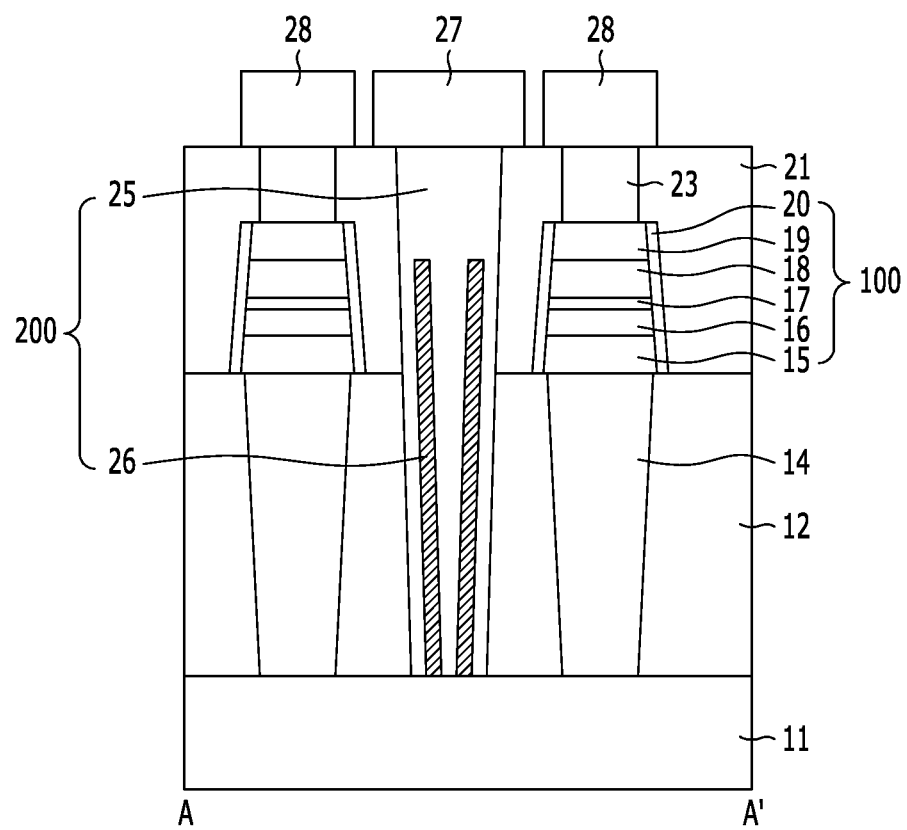
Figure 5D:
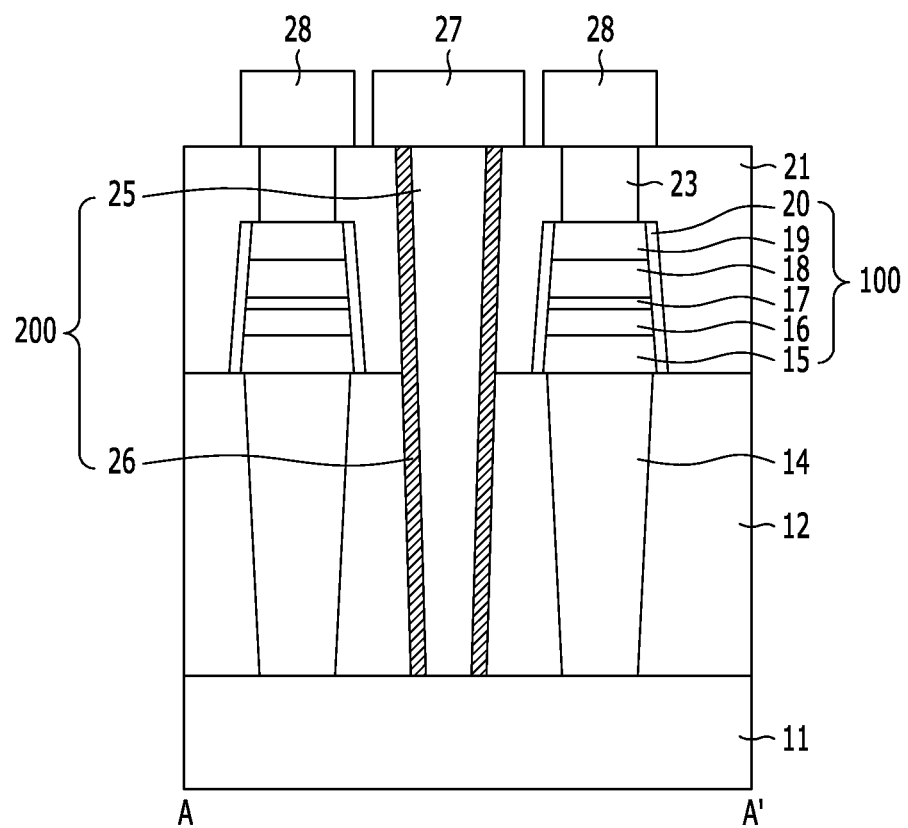

For example, referring to FIG. 5A, the magnetization compensation layer 26 may be positioned in the middle of the source line contact 200. Furthermore, referring to FIG. 5B, the magnetization compensation layer 26 may be positioned in the upper part of the contact plug so as to surround a part of the metal layer 25. Furthermore, referring to FIG. 5C, the magnetization compensation layer 26 may be positioned in the lower part of the source line contact 200. Furthermore, referring to FIG. 5D, the magnetization compensation layer 26 may be formed on sidewalls of the source line contact 200 such that the metal layer 25 is formed in the magnetization compensation layer 26.

Referring to FIGS. 5E to 5H, the magnetization compensation layer 26 may have a cylinder-type structure inserted into the source line contact 200. In particular, the magnetization compensation layer 26 may be formed to have a top surface higher than or identical to that of the tunnel barrier layer 17 of the adjacent variable resistance elements 100, and have sidewalls facing sidewalls of the tunnel barrier layer 17.

Figure 5E:
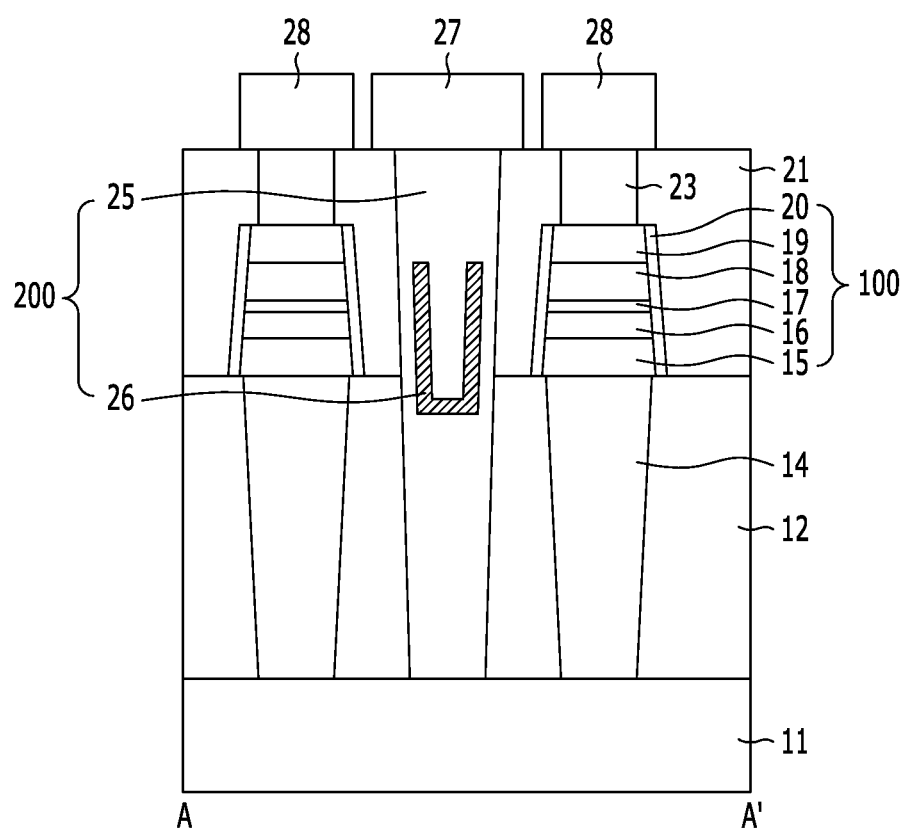
Figure 5F:
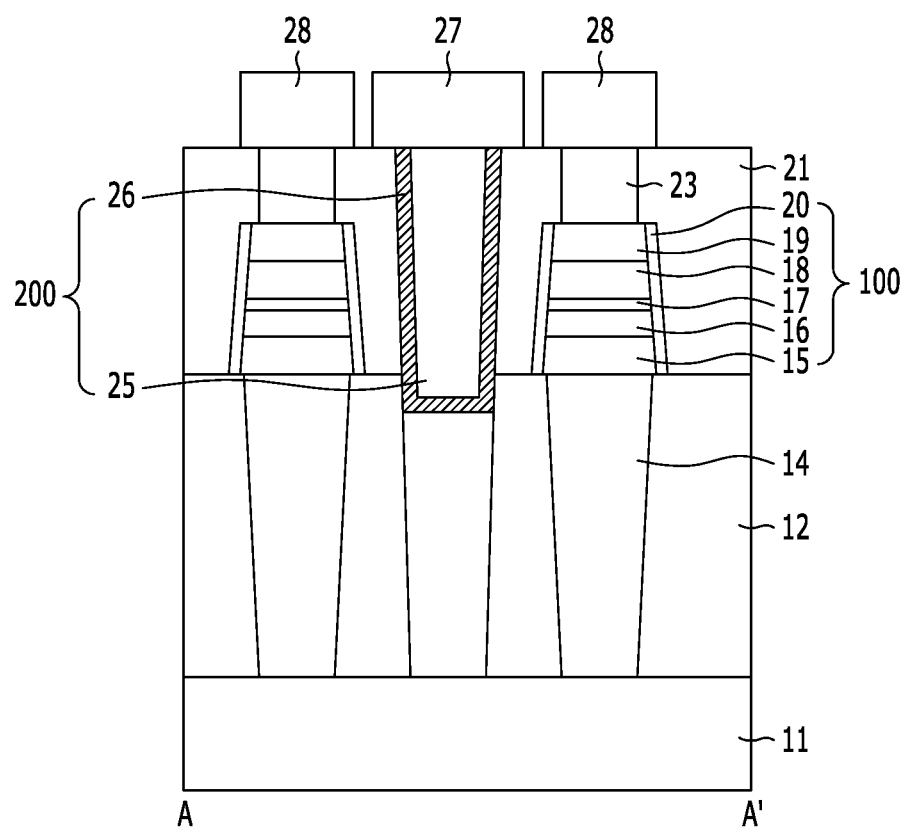
Figure 5G:
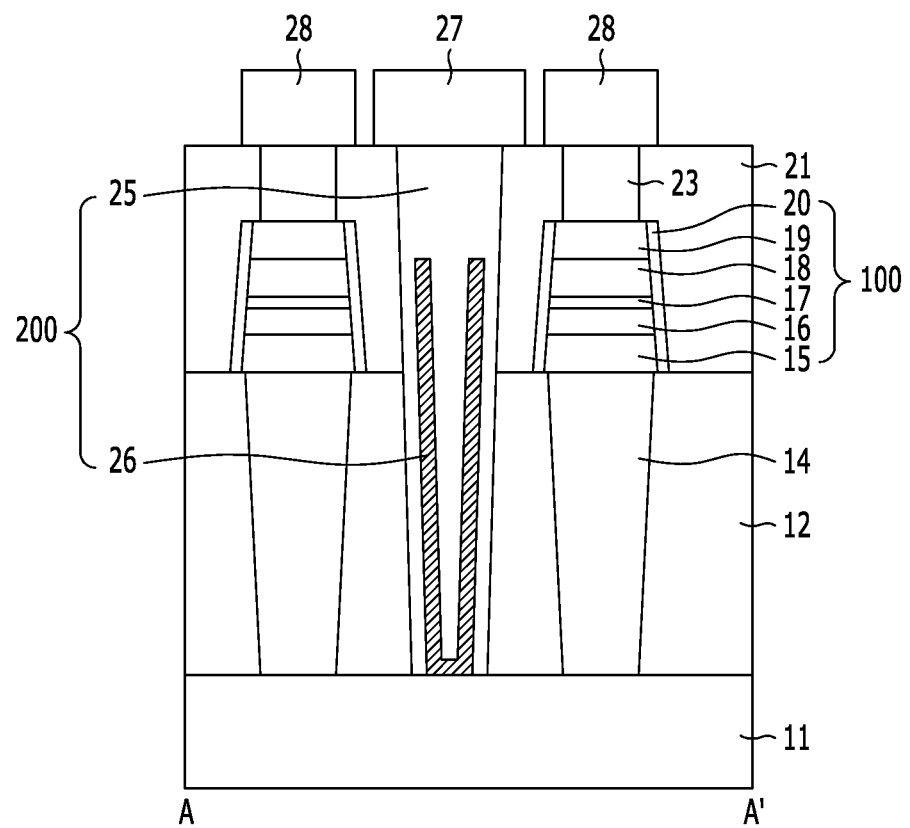
Figure 5H:
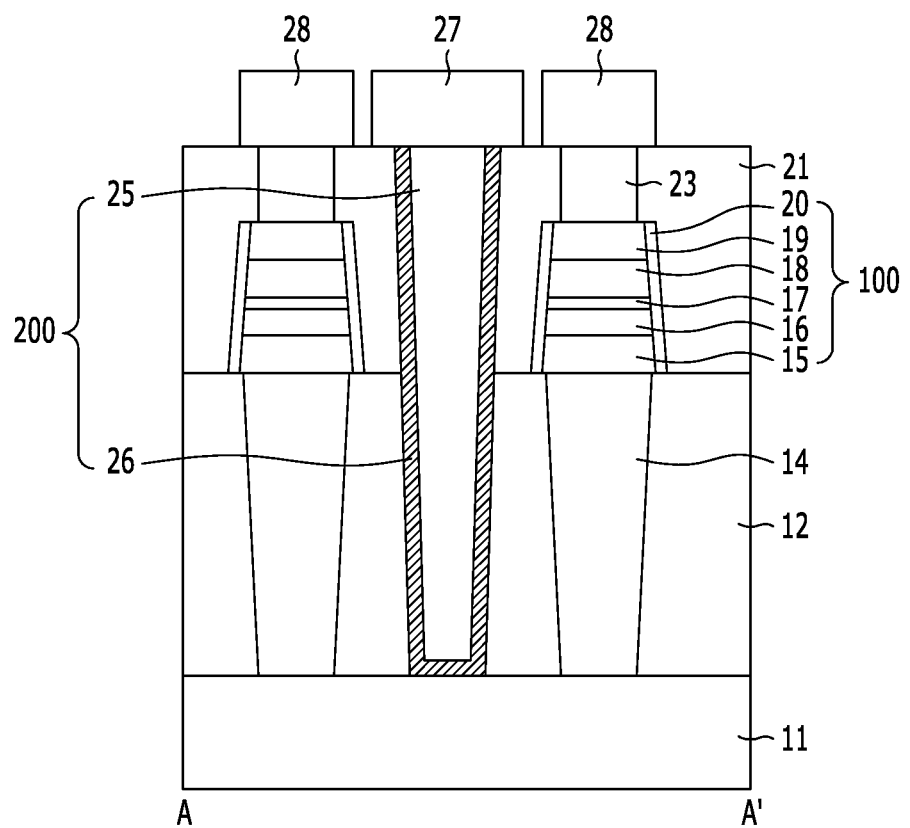

For example, referring to FIG. 5E, the magnetization compensation layer 26 may be positioned in the middle of the source line contact 200. Furthermore, referring to FIG. 5F, the magnetization compensation layer 26 may be formed over a first metal layer 25A and may include a second metal layer 25B formed therein. Furthermore, referring to FIG. 5G, the magnetization compensation layer 26 may be positioned in the lower part of the source line contact 200. Furthermore, referring to FIG. 5H, the magnetization compensation layer 26 may include a metal layer 25 formed therein.

The above structures are one of various implementations and other implementations can be provided. For example, the magnetization compensation layer 26 may be formed to include the same level as the tunnel barrier layer 17. The magnetization compensation layer 26 may be applied to all types of structures in which the magnetization compensation layer 26 is formed to have a thickness greater than the total thickness of the first and second magnetic layers 16 and 18 such that magnetic fields introduced into the first and second magnetic layers 16 and 18 are vertically maintained.

The above and other memory circuits or semiconductor devices based on the disclosed technology may be used in a range of devices or systems. FIGS. 6-10 provide some examples of devices or systems that may implement the memory circuits disclosed herein.

Figure 6:
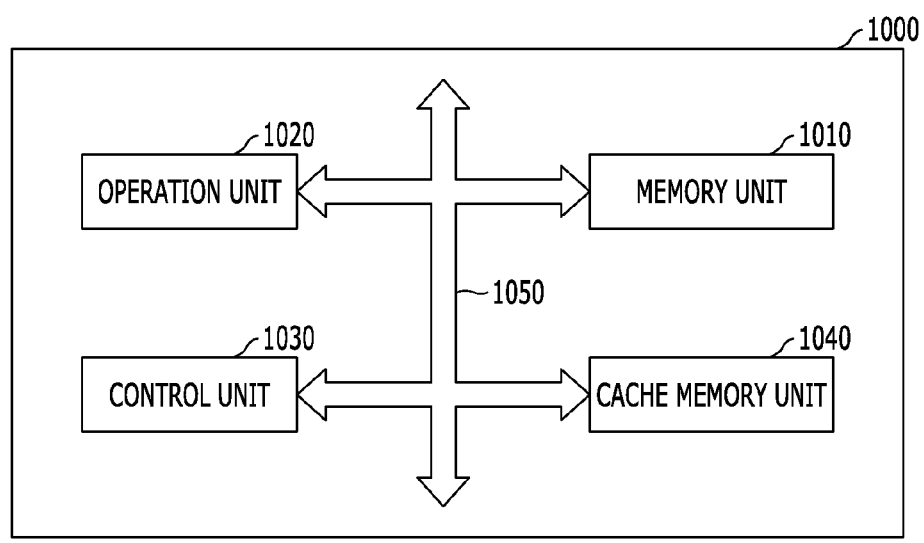
FIG. 6 shows an example of a configuration diagram of a microprocessor implementing memory circuitry based on the disclosed technology.

FIG. 6 is an example of configuration diagram of a microprocessor implementing memory circuitry based on the disclosed technology.

Referring to FIG. 6, the microprocessor 1000 may perform tasks for controlling and tuning a series of processes of receiving data from various external devices, processing the data, and outputting processing results to external devices. The microprocessor 1000 may include a memory unit 1010, an operation unit 1020, a control unit 1030, and so on. The microprocessor 1000 may be various data processing units such as a central processing unit (CPU), a graphic processing unit (GPU), a digital signal processor (DSP) and an application processor (AP).

The memory unit 1010 is a part which stores data in the microprocessor 1000, as a processor register, register or the like. The memory unit 1010 may include a data register, an address register, a floating point register and so on. Besides, the memory unit 1010 may include various registers. The memory unit 1010 may perform the function of temporarily storing data for which operations are to be performed by the operation unit 1020, result data of performing the operations and addresses where data for performing of the operations are stored.

The memory unit 1010 may include one or more of the above-described electronic devices in accordance with the implementations. For example, the memory unit 1010 may include a variable resistance element having a stacked structure of a first electrode, a first magnetic layer having a variable magnetization, a tunnel barrier layer, a second magnetic layer having a pinned magnetization, and a second electrode, and a contact plug arranged at one side of the variable resistance element and separated from the variable resistance element, the contact plug comprising a magnetization compensation layer that is outside the variable resistance element stack. In particular, the magnetization compensation layer may be formed to have a top surface higher than or identical to that of the tunnel barrier layer of the adjacent variable resistance element, sidewalls facing sidewalls of the tunnel barrier layer, and a thickness greater than at least the total thickness of the first and second magnetic layers. Accordingly, higher degree of integration of the memory unit 1010 can be achieved, and a fabrication process may become easy and simpler. Further, a size of the microprocessor 1000 may be reduced.

The operation unit 1020 may perform four arithmetical operations or logical operations according to results that the control unit 1030 decodes commands. The operation unit 1020 may include at least one arithmetic logic unit (ALU) and so on.

The control unit 1030 may receive signals from the memory unit 1010, the operation unit 1020 and an external device of the microprocessor 1000, perform extraction, decoding of commands, and controlling input and output of signals of the microprocessor 1000, and execute processing represented by programs.

The microprocessor 1000 according to the present implementation may additionally include a cache memory unit 1040 which may temporarily store data to be inputted from an external device other than the memory unit 1010 or to be outputted to an external device. In this case, the cache memory unit 1040 may exchange data with the memory unit 1010, the operation unit 1020 and the control unit 1030 through a bus interface 1050.

Figure 7:
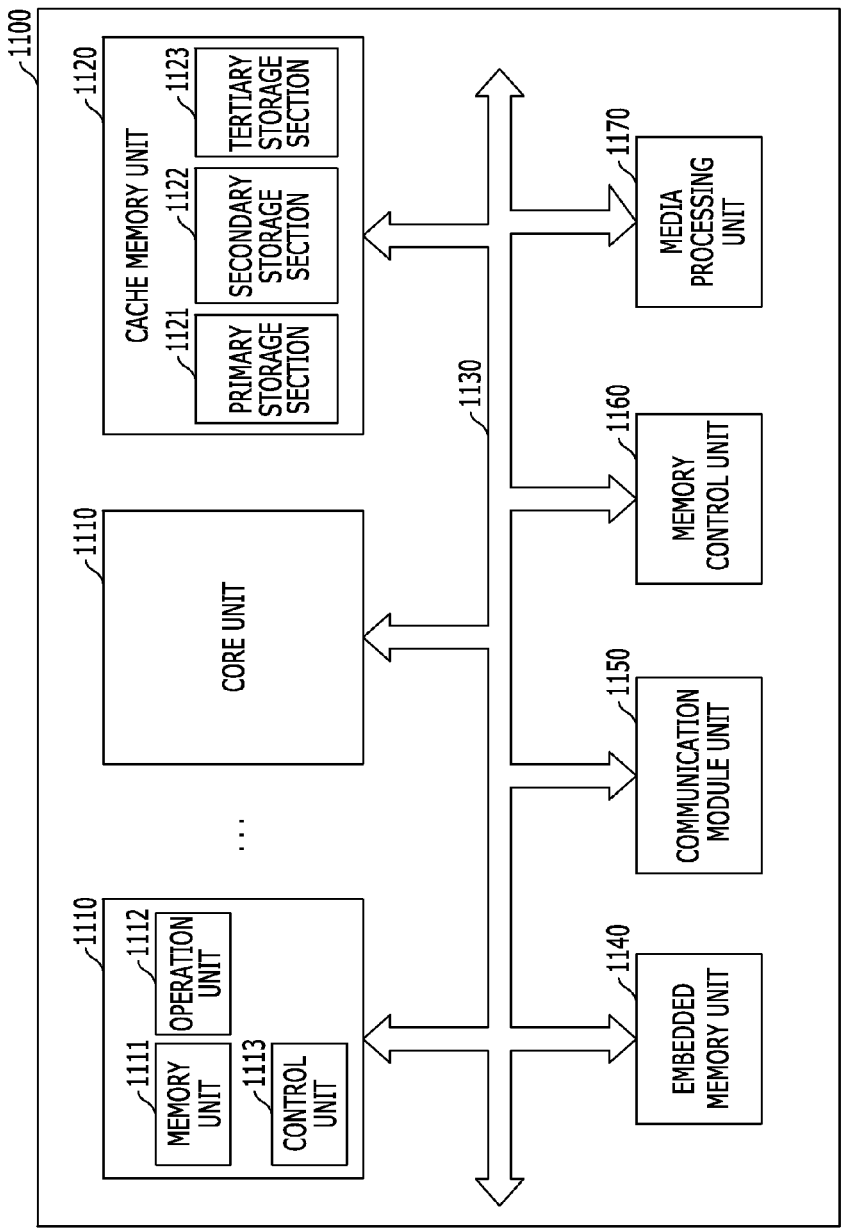
FIG. 7 shows an example of a configuration diagram of a processor implementing memory circuitry based on the disclosed technology.

FIG. 7 is an example of configuration diagram of a processor implementing memory circuitry based on the disclosed technology.

Referring to FIG. 7, the processor 1100 may improve performance and realize multi-functionality by including various functions other than those of a microprocessor which performs tasks for controlling and tuning a series of processes of receiving data from various external devices, processing the data, and outputting processing results to external devices. The processor 1100 may include a core unit 1110 which serves as the microprocessor, a cache memory unit 1120 which serves to storing data temporarily, and a bus interface 1130 for transferring data between internal and external devices. The processor 1100 may include various system-on-chips (SoCs) such as a multi-core processor, a graphic processing unit (GPU) and an application processor (AP).

The core unit 1110 of the present implementation is a part which performs arithmetic logic operations for data inputted from an external device, and may include a memory unit 1111, an operation unit 1112 and a control unit 1113.

The memory unit 1111 is a part which stores data in the processor 1100, as a processor register, a register or the like. The memory unit 1111 may include a data register, an address register, a floating point register and so on. Besides, the memory unit 1111 may include various registers. The memory unit 1111 may perform the function of temporarily storing data for which operations are to be performed by the operation unit 1112, result data of performing the operations and addresses where data for performing of the operations are stored. The operation unit 1112 is a part which performs operations in the processor 1100. The operation unit 1112 may perform four arithmetical operations, logical operations, according to results that the control unit 1113 decodes commands, or the like. The operation unit 1112 may include at least one arithmetic logic unit (ALU) and so on. The control unit 1113 may receive signals from the memory unit 1111, the operation unit 1112 and an external device of the processor 1100, perform extraction, decoding of commands, controlling input and output of signals of processor 1100, and execute processing represented by programs.

The cache memory unit 1120 is a part which temporarily stores data to compensate for a difference in data processing speed between the core unit 1110 operating at a high speed and an external device operating at a low speed. The cache memory unit 1120 may include a primary storage section 1121, a secondary storage section 1122 and a tertiary storage section 1123. In general, the cache memory unit 1120 includes the primary and secondary storage sections 1121 and 1122, and may include the tertiary storage section 1123 in the case where high storage capacity is required. As the occasion demands, the cache memory unit 1120 may include an increased number of storage sections. That is to say, the number of storage sections which are included in the cache memory unit 1120 may be changed according to a design. The speeds at which the primary, secondary and tertiary storage sections 1121, 1122 and 1123 store and discriminate data may be the same or different. In the case where the speeds of the respective storage sections 1121, 1122 and 1123 are different, the speed of the primary storage section 1121 may be largest.

At least one storage section of the primary storage section 1121, the secondary storage section 1122 and the tertiary storage section 1123 of the cache memory unit 1120 may include one or more of the above-described electronic devices in accordance with the implementations. For example, the cache memory unit 1120 may include a variable resistance element having a stacked structure of a first electrode, a first magnetic layer having a variable magnetization, a tunnel barrier layer, a second magnetic layer having a pinned magnetization, and a second electrode, and a contact plug arranged at one side of the variable resistance element and separated from the variable resistance element, the contact plug comprising a magnetization compensation layer that is outside the variable resistance element stack. In particular, the magnetization compensation layer may be formed to have a top surface higher than or identical to that of the tunnel barrier layer of the adjacent variable resistance element, sidewalls facing sidewalls of the tunnel barrier layer, and a thickness larger than at least the total thickness of the first and second magnetic layers. Accordingly, higher degree of integration of the cache memory unit 1120 can be achieved and a fabrication process may become easier and simpler. Further, a size of the processor 1100 may be reduced.

Although it was shown in FIG. 6 that all the primary, secondary and tertiary storage sections 1121, 1122 and 1123 are configured inside the cache memory unit 1120, it is to be noted that all the primary, secondary and tertiary storage sections 1121, 1122 and 1123 of the cache memory unit 1120 may be configured outside the core unit 1110 and may compensate for a difference in data processing speed between the core unit 1110 and the external device. Meanwhile, it is to be noted that the primary storage section 1121 of the cache memory unit 1120 may be disposed inside the core unit 1110 and the secondary storage section 1122 and the tertiary storage section 1123 may be configured outside the core unit 1110 to strengthen the function of compensating for a difference in data processing speed. In another implementation, the primary and secondary storage sections 1121, 1122 may be disposed inside the core units 1110 and tertiary storage sections 1123 may be disposed outside core units 1110.

The bus interface 1130 is a part which connects the core unit 1110, the cache memory unit 1120 and external device and allows data to be efficiently transmitted.

The processor 1100 according to the present implementation may include a plurality of core units 1110, and the plurality of core units 1110 may share the cache memory unit 1120. The plurality of core units 1110 and the cache memory unit 1120 may be directly connected or be connected through the bus interface 1130. The plurality of core units 1110 may be configured in the same way as the above-described configuration of the core unit 1110. In the case where the processor 1100 includes the plurality of core unit 1110, the primary storage section 1121 of the cache memory unit 1120 may be configured in each core unit 1110 in correspondence to the number of the plurality of core units 1110, and the secondary storage section 1122 and the tertiary storage section 1123 may be configured outside the plurality of core units 1110 in such a way as to be shared through the bus interface 1130. The processing speed of the primary storage section 1121 may be larger than the processing speeds of the secondary and tertiary storage section 1122 and 1123. In another implementation, the primary storage section 1121 and the secondary storage section 1122 may be configured in each core unit 1110 in correspondence to the number of the plurality of core units 1110, and the tertiary storage section 1123 may be configured outside the plurality of core units 1110 in such a way as to be shared through the bus interface 1130.

The processor 1100 according to the present implementation may further include an embedded memory unit 1140 which stores data, a communication module unit 1150 which may transmit and receive data to and from an external device in a wired or wireless manner, a memory control unit 1160 which drives an external memory device, and a media processing unit 1170 which processes the data processed in the processor 1100 or the data inputted from an external input device and outputs the processed data to an external interface device and so on. Besides, the processor 1100 may include a plurality of various modules and devices. In this case, the plurality of modules which are added may exchange data with the core units 1110 and the cache memory unit 1120 and with one another, through the bus interface 1130.

The embedded memory unit 1140 may include not only a volatile memory but also a nonvolatile memory. The volatile memory may include a DRAM (dynamic random access memory), a mobile DRAM, an SRAM (static random access memory), and a memory with similar functions to above mentioned memories, and so on. The nonvolatile memory may include a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), a memory with similar functions.

The communication module unit 1150 may include a module capable of being connected with a wired network, a module capable of being connected with a wireless network and both of them. The wired network module may include a local area network (LAN), a universal serial bus (USB), an Ethernet, power line communication (PLC) such as various devices which send and receive data through transmit lines, and so on.

The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB) such as various devices which send and receive data without transmit lines, and so on.

The memory control unit 1160 is to administrate and process data transmitted between the processor 1100 and an external storage device operating according to a different communication standard. The memory control unit 1160 may include various memory controllers, for example, devices which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The media processing unit 1170 may process the data processed in the processor 1100 or the data inputted in the forms of image, voice and others from the external input device and output the data to the external interface device. The media processing unit 1170 may include a graphic processing unit (GPU), a digital signal processor (DSP), a high definition audio device (HD audio), a high definition multimedia interface (HDMI) controller, and so on.

Figure 8:
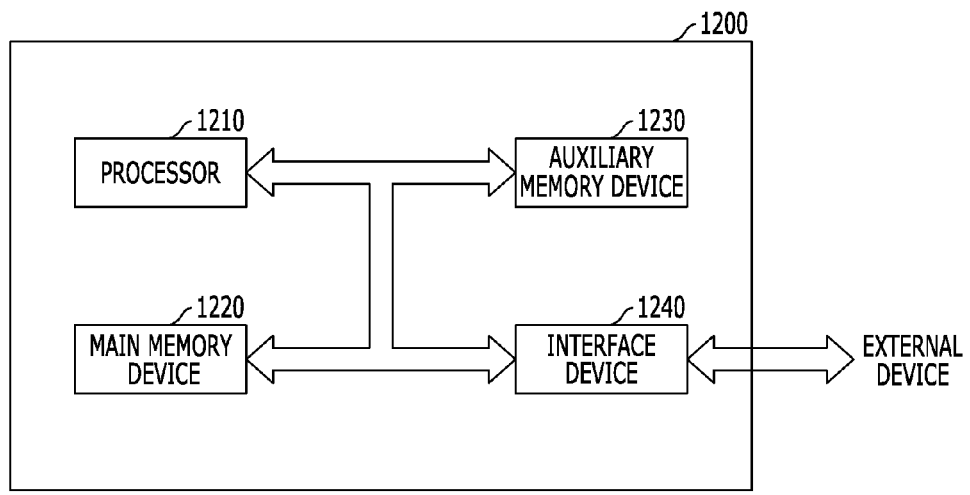
FIG. 8 shows an example of a configuration diagram of a system implementing memory circuitry based on the disclosed technology.

FIG. 8 is an example of configuration diagram of a system implementing memory circuitry based on the disclosed technology.

Referring to FIG. 8, the system 1200 as an apparatus for processing data may perform input, processing, output, communication, storage, etc. to conduct a series of manipulations for data. The system 1200 may include a processor 1210, a main memory device 1220, an auxiliary memory device 1230, an interface device 1240, and so on. The system 1200 of the present implementation may be various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and so on.

The processor 1210 may decode inputted commands and processes operation, comparison, etc. for the data stored in the system 1200, and controls these operations. The processor 1210 may include a microprocessor unit (MPU), a central processing unit (CPU), a single/multi-core processor, a graphic processing unit (GPU), an application processor (AP), a digital signal processor (DSP), and so on.

The main memory device 1220 is a storage which may temporarily store, call and execute program codes or data from the auxiliary memory device 1230 when programs are executed and may conserve memorized contents even when power supply is cut off. The main memory device 1220 may include one or more of the above-described electronic devices in accordance with the implementations. For example, the main memory device 1220 may include a variable resistance element having a stacked structure of a first electrode, a first magnetic layer having a variable magnetization, a tunnel barrier layer, a second magnetic layer having a pinned magnetization, and a second electrode, and a contact plug arranged at one side of the variable resistance element and separated from the variable resistance element, the contact plug comprising a magnetization compensation layer that is outside the variable resistance element stack. In particular, the magnetization compensation layer may be formed to have a top surface higher than or identical to that of the tunnel barrier layer of the adjacent variable resistance element, sidewalls facing sidewalls of the tunnel barrier layer, and a thickness larger than at least the total thickness of the first and second magnetic layers. Accordingly, higher degree of integration of the main memory device 1220 can be achieved, and a fabrication process may become easier and simpler. Thus, a size of the system 1200 can be reduced.

Also, the main memory device 1220 may further include a static random access memory (SRAM), a dynamic random access memory (DRAM), and so on, of a volatile memory type in which all contents are erased when power supply is cut off. Unlike this, the main memory device 1220 may not include the electronic devices according to the implementations, but may include a static random access memory (SRAM), a dynamic random access memory (DRAM), and so on, of a volatile memory type in which all contents are erased when power supply is cut off. The auxiliary memory device 1230 is a memory device for storing program codes or data. While the speed of the auxiliary memory device 1230 is slower than the main memory device 1220, the auxiliary memory device 1230 may store a larger amount of data.

The auxiliary memory device 1230 may include one or more of the above-described electronic devices in accordance with the implementations. For example, the auxiliary memory device 1230 may include a variable resistance element having a stacked structure of a first electrode, a first magnetic layer having a variable magnetization, a tunnel barrier layer, a second magnetic layer having a pinned magnetization, and a second electrode, and a contact plug arranged at one side of the variable resistance element and separated from the variable resistance element, the contact plug comprising a magnetization compensation layer is outside the variable resistance element stack. In particular, the magnetization compensation layer may be formed to have a top surface higher than or identical to that of the tunnel barrier layer of the adjacent variable resistance element, sidewalls facing sidewalls of the tunnel barrier layer, and a thickness larger than at least the total thickness of the first and second magnetic layers. Accordingly, higher degree of integration of the auxiliary memory device 1230 can be achieved, and a fabrication process may become easier and simpler. Thus, a size of the system 1200 may be reduced.

Also, the auxiliary memory device 1230 may further include a data storage system (see the reference numeral 1300 of FIG. 9) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on. Unlike this, the auxiliary memory device 1230 may not include the electronic devices according to the implementations, but may include data storage systems (see the reference numeral 1300 of FIG. 9) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The interface device 1240 may be to perform exchange of commands and data between the system 1200 of the present implementation and an external device. The interface device 1240 may be a keypad, a keyboard, a mouse, a speaker, a mike, a display, various human interface devices (HIDs), a communication device, and so on. The communication device may include a module capable of being connected with a wired network, a module capable of being connected with a wireless network and both of them. The wired network module may include a local area network (LAN), a universal serial bus (USB), an Ethernet, power line communication (PLC), such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and so on.

Figure 9:
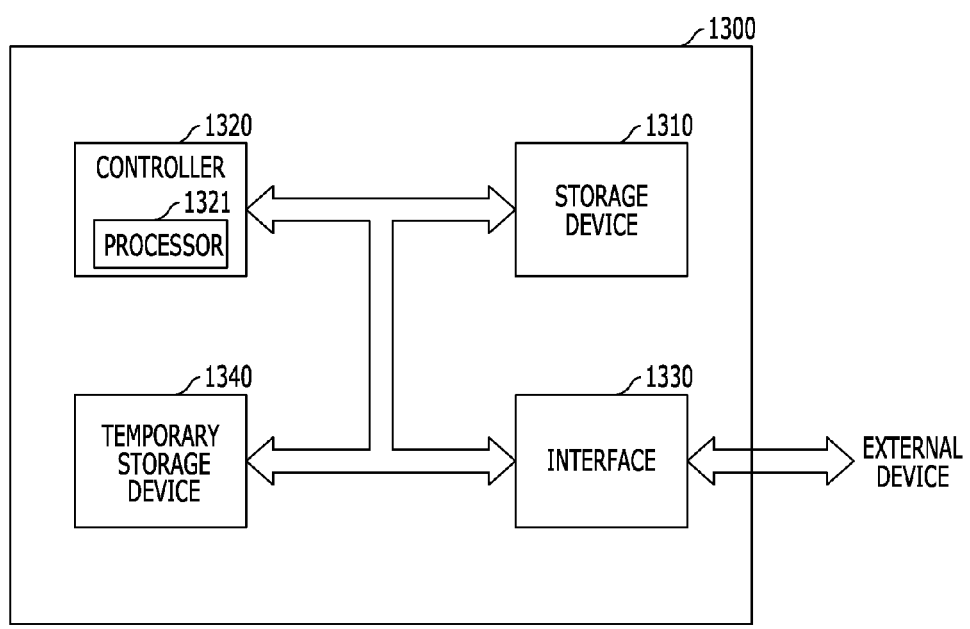
FIG. 9 is an example of configuration diagram of a microprocessor implementing memory circuitry based on the disclosed technology.

FIG. 9 is an example of configuration diagram of a data storage system implementing memory circuitry based on the disclosed technology.

Referring to FIG. 9, the data storage system 1300 may include a storage device 1310 which has a nonvolatile characteristic as a component for storing data, a controller 1320 which controls the storage device 1310, an interface 1330 for connection with an external device, and a temporary storage device 1340 for storing data temporarily. The data storage system 1300 may be a disk type such as a hard disk drive (HDD), a compact disc read only memory (CDROM), a digital versatile disc (DVD), a solid state disk (SSD), and so on, and a card type such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The storage device 1310 may include a nonvolatile memory which stores data semi-permanently. The nonvolatile memory may include a ROM (read only memory), a NOR flash memory, a NAND flash memory, a phase change random access memory (PRAM), a resistive random access memory (RRAM), a magnetic random access memory (MRAM), and so on.

The controller 1320 may control exchange of data between the storage device 1310 and the interface 1330. To this end, the controller 1320 may include a processor 1321 for performing an operation for, processing commands inputted through the interface 1330 from an outside of the data storage system 1300 and so on.

The interface 1330 is to perform exchange of commands and data between the data storage system 1300 and the external device. In the case where the data storage system 1300 is a card type, the interface 1330 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. In the case where the data storage system 1300 is a disk type, the interface 1330 may be compatible with interfaces, such as IDE (Integrated Device Electronics), SATA (Serial Advanced Technology Attachment), SCSI (Small Computer System Interface), eSATA (External SATA), PCMCIA (Personal Computer Memory Card International Association), a USB (universal serial bus), and so on, or be compatible with the interfaces which are similar to the above mentioned interfaces. The interface 1330 may be compatible with one or more interfaces having a different type from each other.

The temporary storage device 1340 may store data temporarily for efficiently transferring data between the interface 1330 and the storage device 1310 according to diversifications and high performance of an interface with an external device, a controller and a system.

Any of the storage device 1310 and the temporary storage device 1340 for temporarily storing data may include one or more of the above-described electronic devices in accordance with the implementations. The storage device 1310 or the temporary storage device 1340 may include a variable resistance element having a stacked structure of a first electrode, a first magnetic layer having a variable magnetization, a tunnel barrier layer, a second magnetic layer having a pinned magnetization, and a second electrode, and a contact plug arranged at one side of the variable resistance element and separated from the variable resistance element, the contact plug comprising a magnetization compensation layer that is outside the variable resistance element stack. In particular, the magnetization compensation layer may be formed to have a top surface higher than or identical to that of the tunnel barrier layer of the adjacent variable resistance element, sidewalls facing sidewalls of the tunnel barrier layer, and a thickness larger than at least the total thickness of the first and second magnetic layers. Accordingly, higher degree of integration of the storage device 1310 and the temporary storage device 1340 can be achieved, and a fabrication process may become easier and simpler. Thus, a size of the data storage system 1300 may be reduced.

Figure 10:
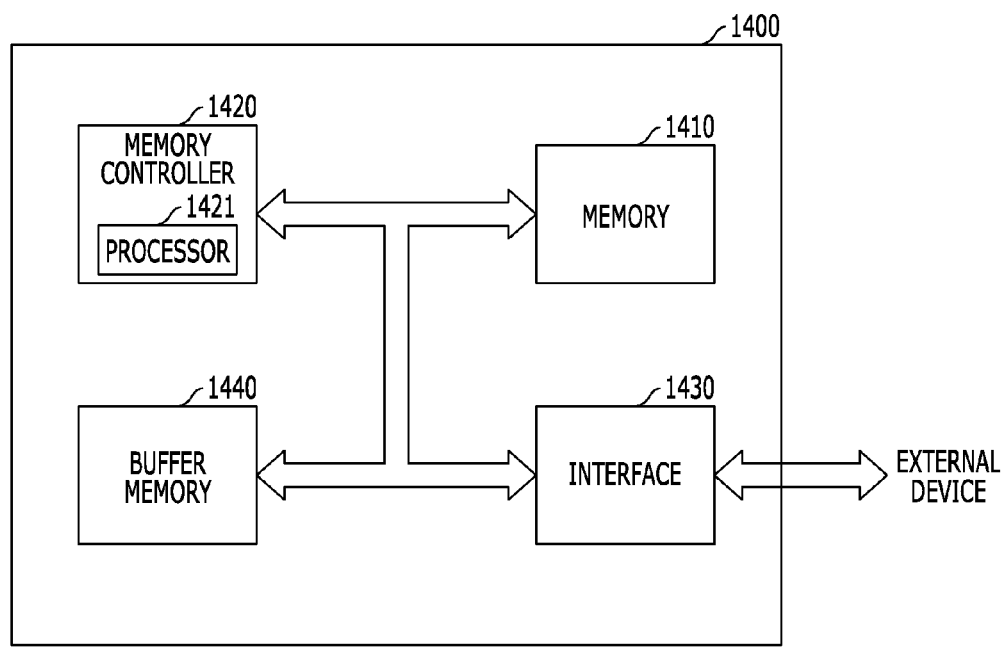
FIG. 10 is an example of configuration diagram of a processor implementing memory circuitry based on the disclosed technology.

FIG. 10 is an example of configuration diagram of a memory system implementing memory circuitry based on the disclosed technology.

Referring to FIG. 10, the memory system 1400 may include a memory 1410 which has a nonvolatile characteristic as a component for storing data, a memory controller 1420 which controls the memory 1410, an interface 1430 for connection with an external device, and so on. The memory system 1400 may be a card type such as a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The memory 1410 for storing data may include one or more of the above-described electronic devices in accordance with the implementations. For example, the memory 1410 may include a variable resistance element having a stacked structure of a first electrode, a first magnetic layer having a variable magnetization, a tunnel barrier layer, a second magnetic layer having a pinned magnetization, and a second electrode, and a contact plug arranged at one side of the variable resistance element and separated from the variable resistance element, the contact plug comprising a magnetization compensation layer that is outside that is outside the variable resistance element stack. In particular, the magnetization compensation layer may be formed to have a top surface higher than or identical to that of the tunnel barrier layer of the adjacent variable resistance element, sidewalls facing sidewalls of the tunnel barrier layer, and a thickness larger than at least the total thickness of the first and second magnetic layers. Accordingly, higher degree of integration of the non-volatile memory 1410 can be achieved, and a fabrication process may become easier and simpler. Thus, a size of the memory system 1400 may be reduced.

Also, the memory 1410 according to the present implementation may further include a ROM (read only memory), a NOR flash memory, a NAND flash memory, a phase change random access memory (PRAM), a resistive random access memory (RRAM), a magnetic random access memory (MRAM), and so on, which have a nonvolatile characteristic.

The memory controller 1420 may control exchange of data between the memory 1410 and the interface 1430. To this end, the memory controller 1420 may include a processor 1421 for performing an operation for and processing commands inputted through the interface 1430 from an outside of the memory system 1400.

The interface 1430 is to perform exchange of commands and data between the memory system 1400 and the external device. The interface 1430 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. The interface 1430 may be compatible with one or more interfaces having a different type from each other.

The memory system 1400 according to the present implementation may further include a buffer memory 1440 for efficiently transferring data between the interface 1430 and the memory 1410 according to diversification and high performance of an interface with an external device, a memory controller and a memory system. For example, the buffer memory 1440 for temporarily storing data may include one or more of the above-described electronic devices in accordance with the implementations. The buffer memory 1440 may include a variable resistance element having a stacked structure of a first electrode, a first magnetic layer having a variable magnetization, a tunnel barrier layer, a second magnetic layer having a pinned magnetization, and a second electrode, and a contact plug arranged at one side of the variable resistance element and separated from the variable resistance element, the contact plug comprising a magnetization compensation layer that is outside that is outside the variable resistance element stack. In particular, the magnetization compensation layer may be formed to have a top surface higher than or identical to that of the tunnel barrier layer of the adjacent variable resistance element, sidewalls facing sidewalls of the tunnel barrier layer, and a thickness larger than at least the total thickness of the first and second magnetic layers. Accordingly, higher degree of integration of the buffer memory 1440 can be achieved, and a fabrication process may become easier and simpler. Thus, a size of the memory system 1400 may be reduced.

Moreover, the buffer memory 1440 according to the present implementation may further include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic. Unlike this, the buffer memory 1440 may not include the electronic devices according to the implementations, but may include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic.

Features in the above examples of electronic devices or systems in FIGS. 6-10 based on the memory devices disclosed in this document may be implemented in various devices, systems or applications. Some examples include mobile phones or other portable communication devices, tablet computers, notebook or laptop computers, game machines, smart TV sets, TV set top boxes, multimedia servers, digital cameras with or without wireless communication functions, wrist watches or other wearable devices with wireless communication capabilities.

In accordance with the aforementioned method of forming a variable resistance element, the contact plug arranged at one side of the variable resistance element and separated from the variable resistance element, the contact plug comprising the magnetization compensation layer that produces a magnetic field at the variable resistance element to reduce an influence of a magnetic field of the second magnetic layer on the first magnetic layer. Accordingly, the total thickness of the variable resistance element can be reduced, and thus, it is possible to secure an etch margin during the patterning process.

Furthermore, when the magnetization compensation layer is formed, a horizontal magnetic material may be used to reduce the difficulty level of the process, and one contact plug may have a uniform field influence on a plurality of variable resistance elements.

While this patent document contains many specifics, these should not be construed as limitations on the scope of any invention or of what may be claimed, but rather as descriptions of features that may be specific to particular implementations of particular inventions. Certain features that are described in this patent document in the context of separate implementations may also be implemented in combination in a single implementation. Conversely, various features that are described in the context of a single implementation may also be implemented in multiple implementations separately or in any suitable subcombination. Moreover, although features may be described above as acting in certain combinations and even initially claimed as such, one or more features from a claimed combination may in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the implementations described in this patent document should not be understood as requiring such separation in all implementations.

Only a few implementations and examples are described. Other implementations, enhancements and variations may be made based on what is described and illustrated in this patent document.

What is claimed is:

1. An electronic device comprising a semiconductor memory unit that includes:
   a variable resistance element having a stacked structure of a first magnetic layer having a variable magnetization, a tunnel barrier layer, and a second magnetic layer having a pinned magnetization; and
   a contact plug arranged at one side of the variable resistance element and separated from the variable resistance element, the contact plug comprising a magnetization compensation layer that produces a magnetic field at the variable resistance element to reduce an influence of a magnetic field of the second magnetic layer on the first magnetic layer.

2. The electronic device of claim 1, wherein the magnetization compensation layer has a thickness greater than a width thereof.

3. The electronic device of claim 1, wherein the magnetization compensation layer comprises a conductive material having a horizontal magnetic property in that a magnetization of the magnetization compensation layer is in a plane of the magnetization compensation layer.

4. The electronic device of claim 1, wherein the magnetization compensation layer comprises one of Co, Fe, Ni or Nd, or a mixture of two or more of Co, Fe, Ni or Nd.

5. The electronic device of claim 1, wherein the semiconductor memory comprises a plurality of variable resistance elements, the contact plug is provided between adjacent variable resistance elements to be arranged at a predetermined interval from each of the adjacent variable resistance elements so that the magnetization compensation layer in the contact plug produces an equal magnetic field at the adjacent variable resistance elements.

6. The electronic device of claim 5, wherein the plurality of variable resistance elements are arranged in a matrix shape.

7. The electronic device of claim 1, wherein the magnetization compensation layer has a thickness greater than the sum of thicknesses of the first and second magnetic layers.

8. The electronic device of claim 1, wherein the first magnetic layer and the second magnetic layer are ferromagnetic layers.

9. The electronic device of claim 1, wherein the magnetization compensation layer is formed to have a top surface higher than or identical to that of the tunnel barrier layer of the variable resistance element.

10. The electronic device of claim 1, wherein the contact plug comprises a metal layer, and has a stacked structure of the metal layer and the magnetization compensation layer.

11. The electronic device of claim 1, wherein the contact plug comprises two metal layers, and the magnetization compensation layer is formed between the two metal layers.

12. The electronic device of claim 1, wherein the contact plug comprises a metal layer, and the magnetization compensation layer is formed in the metal layer.

13. The electronic device according to claim 1, further comprising a microprocessor which includes:
   a control unit configured to receive a signal including a command from an outside of the microprocessor, and performs extracting, decoding of the command, or controlling input or output of a signal of the microprocessor;
   an operation unit configured to perform an operation based on a result that the control unit decodes the command; and
   a memory unit configured to store data for performing the operation, data corresponding to a result of performing the operation, or an address of data for which the operation is performed,
   wherein the semiconductor memory unit that includes the variable resistance element is a part of the memory unit in the microprocessor.

14. The electronic device according to claim 1, further comprising a processor which includes:
   a core unit configured to perform, based on a command inputted from an outside of the processor, an operation corresponding to the command, by using data;
   a cache memory unit configured to store data for performing the operation, data corresponding to a result of performing the operation, or an address of data for which the operation is performed; and
   a bus interface connected between the core unit and the cache memory unit, and configured to transmit data between the core unit and the cache memory unit,
   wherein the semiconductor memory unit that includes the variable resistance element is a part of the cache memory unit in the processor.

15. The electronic device according to claim 1, further comprising a processing system which includes:
   a processor configured to decode a command received by the processor and control an operation for information based on a result of decoding the command;
   an auxiliary memory device configured to store a program for decoding the command and the information;
   a main memory device configured to call and store the program and the information from the auxiliary memory device such that the processor performs the operation using the program and the information when executing the program; and
   an interface device configured to perform communication between at least one of the processor, the auxiliary memory device and the main memory device and the outside,
   wherein the semiconductor memory unit that includes the variable resistance element is a part of the auxiliary memory device or the main memory device in the processing system.

16. The electronic device according to claim 1, further comprising a data storage system which includes:
   a storage device configured to store data and conserve stored data regardless of power supply;
   a controller configured to control input and output of data to and from the storage device according to a command inputted form an outside;
   a temporary storage device configured to temporarily store data exchanged between the storage device and the outside; and
   an interface configured to perform communication between at least one of the storage device, the controller and the temporary storage device and the outside,
   wherein the semiconductor memory unit that includes the variable resistance element is a part of the storage device or the temporary storage device in the data storage system.

17. The electronic device according to claim 1, further comprising a memory system which includes:
   a memory configured to store data and conserve stored data regardless of power supply;

a memory controller configured to control input and output of data to and from the memory according to a command inputted form an outside;

a buffer memory configured to buffer data exchanged between the memory and the outside; and an interface configured to perform communication between at least one of the memory, the memory controller and the buffer memory and the outside, wherein the semiconductor memory unit that includes the variable resistance element is a part of the memory or the buffer memory in the memory system.

18. An electronic device comprising a semiconductor memory unit that includes:

at least two variable resistance elements, each variable resistance element having a stacked structure of a free magnetic layer, a tunnel barrier layer, and a pinned magnetic layer; and a contact plug arranged between a pair of the variable resistance elements to be apart from each of the two variable resistance elements and including a magnetization compensation layer having an opposite magnetization direction to a magnetization direction of the pinned magnetic layer.

19. The electronic device of claim 18, wherein the magnetization compensation layer is formed to have a thickness greater than at least the total thickness of the free magnetic layer and the pinned magnetic layer.

20. The electronic device of claim 18, wherein the magnetization compensation layer has a pillar shape, a cylinder shape, or a ring shape.

21. An electronic device comprising a semiconductor memory that includes:

a substrate;

a matrix of variable resistance elements formed over the substrate, each variable resistance element exhibiting different resistance states and including a stacked structure of a first magnetic layer having a variable magnetization, a second magnetic layer having a pinned magnetization and a tunnel barrier layer between the first and second magnetic layers to provide electronic tunneling, the tunnel barrier layer including a dielectric material; and switching elements formed over the substrate between the variable resistance elements and coupled to the matrix of variable resistance elements to select one or more of the variable resistance elements, wherein each switching element includes a contact plug that includes a magnetization compensation layer inside the contact plug to provide an electrical connection and the magnetization compensation layer is structured to be electrically conductive and to produce a magnetic field at an adjacent variable resistance element to reduce an influence of a magnetic field of the second magnetic layer on the first magnetic layer of the adjacent variable resistance element.

22. The electronic device of claim 21, wherein the magnetization compensation layer in the contact plug of each switching element exhibits a magnetization that is opposite in direction to the pinned magnetization of the second magnetic layer of the adjacent variable resistance element.

23. The electronic device of claim 21, wherein the magnetization compensation layer in the contact plug of each switching element is formed to have a thickness greater than a total thickness of the first and second magnetic layers of the adjacent variable resistance element.

24. The electronic device of claim 21, wherein the magnetization compensation layer in the contact plug of each switching element is formed to have a thickness greater than a width of the contact plug.

25. The electronic device of claim 21, wherein the contact plug of each switching element having the magnetization compensation layer includes a top metal layer in contact with a top of the magnetization compensation layer and a bottom metal layer in contact with a bottom of the magnetization compensation layer.

26. The electronic device of claim 21, wherein each switching element includes a transistor or a diode.

27. The electronic device of claim 21, wherein the first and second magnetic layers in each variable resistance element have their magnetizations perpendicular to the substrate.

28. The electronic device of claim 21, wherein the first and second magnetic layers in each variable resistance element have their magnetizations parallel to the substrate.

* * * * *